(12) United States Patent
Kodani et al.

(10) Patent No.: US 9,089,041 B2
(45) Date of Patent: Jul. 21, 2015

(54) METHOD OF FABRICATING A WIRING BOARD

(71) Applicant: SHINKO ELECTRIC INDUSTRIES CO., LTD., Nagano (JP)

(72) Inventors: Kotaro Kodani, Nagano (JP); Kentaro Kaneko, Nagano (JP); Kazuhiro Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 389 days.

(21) Appl. No.: 13/742,681

(22) Filed: Jan. 16, 2013

(65) Prior Publication Data

US 2013/0134127 A1 May 30, 2013

Related U.S. Application Data

(62) Division of application No. 12/566,764, filed on Sep. 25, 2009, now abandoned.

(30) Foreign Application Priority Data

Oct. 3, 2008 (JP) .................................. 2008-259016

(51) Int. Cl.
*H05K 3/02* (2006.01)
*H05K 3/10* (2006.01)
(Continued)

(52) U.S. Cl.
CPC .............. *H05K 3/00* (2013.01); *H01L 21/4846* (2013.01); *H01L 23/49811* (2013.01); *H01L 23/49822* (2013.01); *H01L 23/49827* (2013.01); *H05K 1/113* (2013.01); *H05K 3/4682* (2013.01); *H01L 2224/16225* (2013.01); *H01L 2224/16235* (2013.01); *H01L 2924/01046* (2013.01); *H01L 2924/01079* (2013.01); *H01L 2924/15174* (2013.01); *H05K 3/205* (2013.01); *H05K 2201/0338* (2013.01); *H05K 2201/0341* (2013.01); *H05K 2201/09472* (2013.01); *H05K 2201/10674* (2013.01);
(Continued)

(58) Field of Classification Search
CPC ................... H01L 2224/97; H01L 21/76898; H01L 24/97; H01L 2224/16235; H01L 23/481; H01L 23/49822; H01L 24/03; H01L 24/11; H01L 25/50; H05K 1/113; H05K 2201/09472; H05K 2203/0376; H05K 3/00
USPC ................... 29/846, 825, 829, 830, 832, 852; 438/121, 597, 612, 616, 618
See application file for complete search history.

(56) References Cited

U.S. PATENT DOCUMENTS 6,281,446 B1 8/2001 Sakamoto et al.
6,418,615 B1 * 7/2002 Rokugawa et al. ............. 29/852
(Continued)

FOREIGN PATENT DOCUMENTS

JP 2003-229512 A 8/2003
JP 2004-064082 A 2/2004
(Continued)

*Primary Examiner* — Thiem Phan
(74) *Attorney, Agent, or Firm* — IPUSA, PLLC

(57) ABSTRACT

A wiring board includes an electrode pad having a first surface and a second surface located on an opposite side from the first surface, a conductor pattern connected to the first surface of the electrode pad, and an insulator layer embedded with the electrode pad and the conductor pattern. The insulator layer covers an outer peripheral portion of the second surface of the electrode pad.

6 Claims, 47 Drawing Sheets

(51) Int. Cl.
   *H05K 3/00*     (2006.01)
   *H01L 21/48*    (2006.01)
   *H01L 23/498*   (2006.01)
   *H05K 1/11*     (2006.01)
   *H05K 3/46*     (2006.01)
   *H05K 3/20*     (2006.01)

(52) U.S. Cl.
   CPC ............... *H05K 2203/0353* (2013.01); *H05K 2203/0361* (2013.01); *H05K 2203/0369* (2013.01); *H05K 2203/0376* (2013.01); *H05K 2203/1184* (2013.01)

(56) References Cited

U.S. PATENT DOCUMENTS

| | | | |
|---|---|---|---|
| 6,506,982 | B1 | 1/2003 | Shigi et al. |
| 6,818,836 | B2 | 11/2004 | Shiraishi et al. |
| 7,517,730 | B2 * | 4/2009 | Cho .............................. 438/122 |
| 7,582,551 | B2 | 9/2009 | Kodani et al. |
| 7,626,829 | B2 | 12/2009 | Watanabe et al. |
| 2003/0045024 | A1 | 3/2003 | Shimoto et al. |
| 2003/0127747 | A1 | 7/2003 | Kajiwara et al. |
| 2003/0155638 | A1 | 8/2003 | Ito |
| 2003/0161129 | A1 | 8/2003 | Kusano et al. |
| 2004/0074088 | A1 | 4/2004 | Nakamura et al. |
| 2007/0124924 | A1 | 6/2007 | Nakamura |
| 2008/0179740 | A1 | 7/2008 | Liao |
| 2008/0246146 | A1 | 10/2008 | Kodani et al. |
| 2009/0095514 | A1 | 4/2009 | Kaneko |
| 2010/0132997 | A1 | 6/2010 | Hando |

FOREIGN PATENT DOCUMENTS

| | | |
|---|---|---|
| JP | 2005-005742 A | 1/2005 |
| JP | 2005-244108 A | 9/2005 |

* cited by examiner

METHOD OF FABRICATING A WIRING BOARD

CROSS-REFERENCE TO RELATED APPLICATIONS

This application is a divisional application of a U.S. patent application Ser. No. 12/566,764 filed on Sep. 25, 2009, which is based upon and claims the benefit of priority from the prior Japanese Patent Application No. 2008-259016 filed on Oct. 3, 2008, the entire contents of which are hereby incorporated by reference.

BACKGROUND OF THE INVENTION

1. Field of the Invention

The present invention relates to a wiring board having electrode pads, conductor patterns connected to the electrode pads and an insulator layer embedded with the electrodes and the conductor patterns, and to a method of fabricating such a wiring board.

2. Description of the Related Art

Wiring boards having various shapes and structures have been proposed for use in mounting thereon electronic components such as semiconductor chips. Recently, there are increased demands to reduce the thickness and size of the wiring board mounted with the semiconductor chip, due to the reduced thickness and size of the semiconductor chip.

Known methods of forming thin wiring boards include the so-called build-up method, for example. The build-up method fabricates a multi-level (or multi-layer) wiring board by stacking on a core substrate build-up layers made of an epoxy resin material, for example, in order to form interlayer insulators for the wirings.

The core substrate is made of a prepeg material or the like, and supports the soft build-up layer prior to curing and suppresses warping caused by the curing of the build-up layer, during the fabrication process of the wiring board. However, the thickness of the core substrate, which forms the base for the wiring board, interferes with the further reduction in the thickness of the wiring board that is fabricated using the build-up method.

In order to further reduce the thickness of the wiring board that is fabricated using the build-up method, a method has been proposed to remove a support plate which supports the wiring board (or build-up layer) after forming the wiring board on the support plate by the build-up method, in a Japanese Laid-Open Patent Publication No. 2005-5742, for example.

FIG. 1 is a cross sectional view illustrating an example of a conventional wiring board. As illustrated in FIG. 1, an electrode pad 1 is formed on a support plate (not shown) which is removed by etching, for example, and an insulator layer 2 made of a resin material is formed to cover the periphery of the electrode pad 1. The electrode pad 1 is connected to a conductor pattern 3, such as a via plug. The electrode pad 1 may be formed by a stacked structure made up of an Au layer 1A and a Ni layer 1B, for example.

When forming the wiring board on the support plate using the build-up method, a surface 2A of the insulator layer 2 and a surface 1C of the electrode pad 1 are formed on the same plane. For this reason, delamination occurs at a boundary surface between a side surface of the electrode pad 1 and the insulator layer 2, at a portion indicated by A in FIG. 1.

As a countermeasure against the delamination described above, a structure has been proposed to form a wall portion that extends from an exposed surface of the electrode pad towards an opposite side from the exposed surface by modifying the shape of the electrode pad, in a Japanese Laid-Open Patent Publication No. 2005-244108, for example. However, when the shape of the electrode pad is complex as in the case of this proposed electrode pad structure, the number of processes required to form the electrode pad increases, to thereby increase the fabrication cost of the wiring board.

On the other hand, a structure in which the electrode pad is embedded in the insulator layer has been proposed in a Japanese Laid-Open Patent Publications No. 2004-64082 and No. 2003-229512, for example. However, according to this proposed structure, the delamination at the boundary surface between the electrode pad and the insulator layer cannot be suppressed satisfactorily, and it is difficult to prevent the reliability of the wiring board from deteriorating due to the delamination.

SUMMARY OF THE INVENTION

Accordingly, it is a general object of the present invention to provide a novel and useful wiring board and method of fabricating the same, in which the problems described above are suppressed.

Another and more specific object of the present invention is to provide a wiring board and a method of fabricating the same, which suppresses delamination from being generated between a side surface of an electrode pad and a side surface of an insulator layer, to thereby improve the reliability of the wiring board.

According to one aspect of the present invention, there is provided a wiring board comprising an electrode pad having a first surface and a second surface located on an opposite side from the first surface; a conductor pattern connected to the first surface of the electrode pad; and an insulator layer embedded with the electrode pad and the conductor pattern, wherein the insulator layer covers an outer peripheral portion of the second surface of the electrode pad.

According to one aspect of the present invention, there is provided a method of fabricating a wiring board, comprising an electrode pad forming step forming an electrode pad on a support plate made of a first metal; a projecting part forming step forming, on the support plate at a portion opposing the electrode pad, a projecting part which exposes a surface of the electrode pad on a side opposing the support plate and contacts the electrode pad, by etching the support plate; an insulator layer forming step forming an insulator layer covering the electrode pad, the projecting part, and a surface of the support plate formed with the projecting part; a conductor pattern forming step forming, on the insulator layer, a conductor pattern connected to the electrode pad; and a support plate removing step removing the support plate formed with the projecting part by an etching, after the conductor pattern forming step, to thereby expose a portion of the surface of the electrode pad on the side opposing the support plate and form in the insulator layer an opening having a shape corresponding to a shape of the projecting part.

According to one aspect of the present invention, there is provided a method of fabricating a wiring board, comprising a metal layer forming step forming a metal layer on a support plate made of a first metal; an electrode pad forming step forming an electrode pad on the metal layer; a projecting part forming step forming a projecting part by etching the metal layer, and exposing an outer peripheral portion of a surface of the electrode pad in contact with the projecting part; an insulator layer forming step forming an insulator layer to cover the projecting part, the electrode pad, and a surface of the support plate formed with the projecting part, after the projecting part forming step; a conductor pattern forming step forming, on the insulator layer, a conductor pattern connected to the electrode pad; a support plate removing step removing the support plate by an etching, after the conductor pattern forming step; and a projecting part removing step removing the projecting part, after the conductor pattern forming step, to thereby expose a portion of the surface of the electrode pad in contact with the projecting part and form in the insulator layer an opening having a shape corresponding to a shape of the projecting part.

Other objects and further features of the present invention will be apparent from the following detailed description when read in conjunction with the accompanying drawings.

DESCRIPTION OF THE PREFERRED EMBODIMENTS

A description will be given of each embodiment of the present invention, by referring to FIGS. 2 through 63.

First Embodiment

Figure 1:
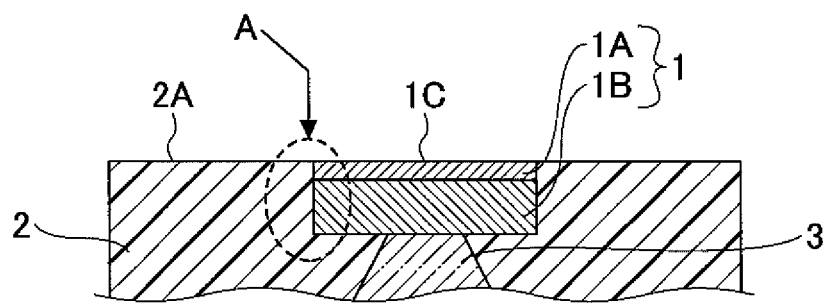
FIG. 1 is a cross sectional view illustrating an example of a conventional wiring board.
Figure 2:
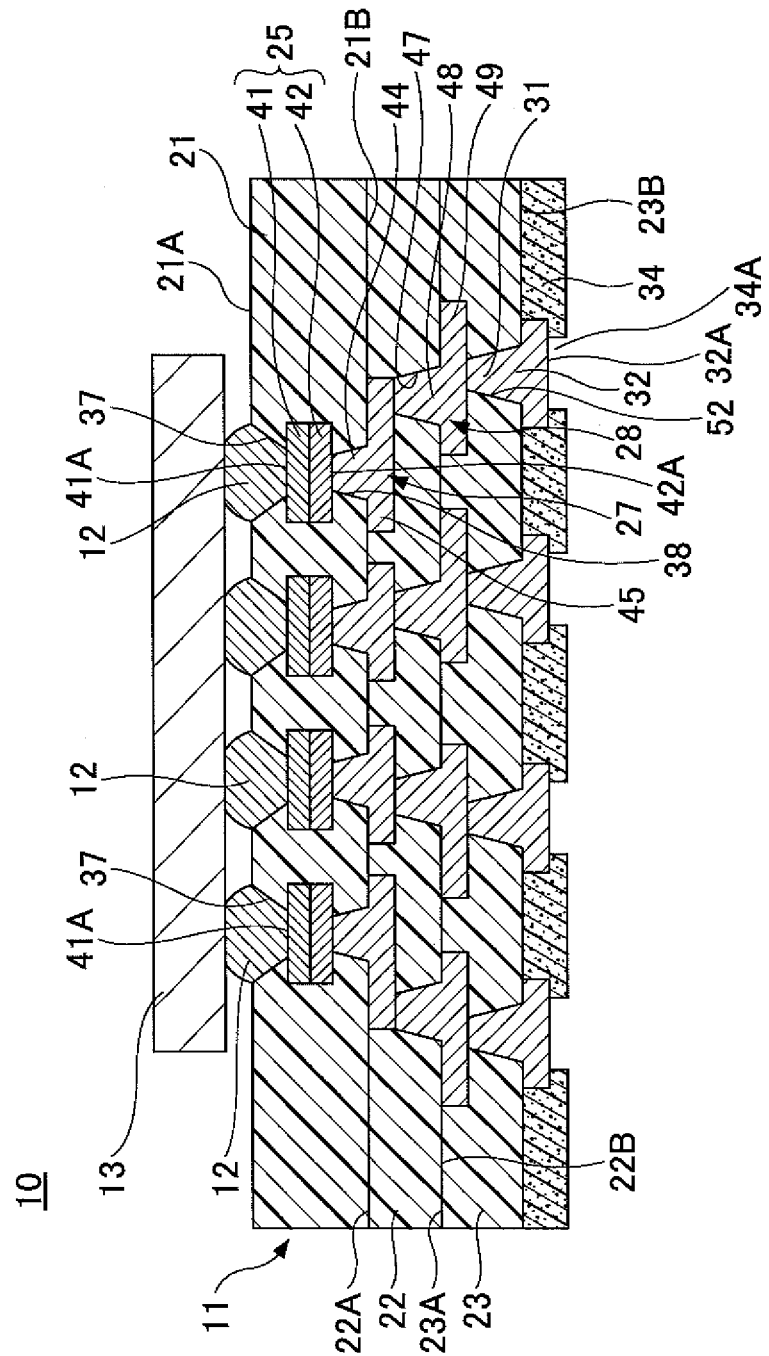
FIG. 2 is a cross sectional view illustrating a semiconductor device in a first embodiment of the present invention.
Figure 3:
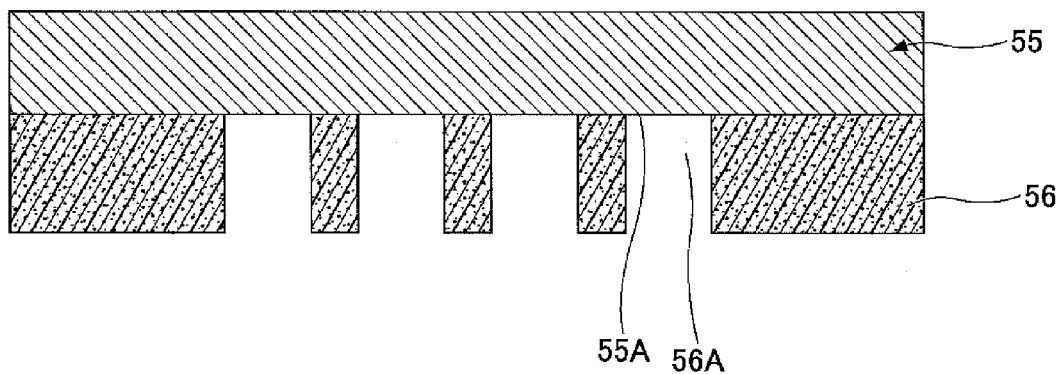
FIGS. 3 through 12 are cross sectional views for explaining fabrication processes of the semiconductor device in the first embodiment of the present invention.

FIG. 2 is a cross sectional view illustrating a semiconductor device in a first embodiment of the present invention. The semiconductor device according to the present invention is also referred to as a semiconductor package.

A semiconductor device 10 of this first embodiment includes a wiring board 11 and an electronic component 13. The wiring board 11 includes stacked insulator layers 21, 22 and 23, electrode pads 25, conductor patterns 27 and 28, vias 31, pads 32 for external connection, and a solder resist layer 34.

The insulator layer 21 is stacked on a surface 22A of the insulator layer 22. The electrode pads 25 and via parts 44 are embedded in the insulator layer 21, and the via part 44 forms a constituent element of the conductor pattern 27. The insulator layer 21 includes openings 37 and 38. The opening 37 is provided in a portion of the insulator layer 21 on the opposite side from a portion of the insulator layer 21 making contact with the surface 22A of the insulator layer 22. The opening 37 exposes a portion of a surface 41A of a metal layer 41, where a terminal 12 for external connection and electrically connecting to the electronic component 13 is provided. The metal layer 41 forms the electrode pad 25, and the surface 41A forms a second surface of the electrode pad 25. A first surface of the electrode pad 25 will be described later. The terminal 12, which electrically connects the wiring board 11 to the electronic component 13, is provided in the opening 37 by solder or Au bump, for example. The insulator layer 21 is provided to cover an outer peripheral portion of the surface 41A of the metal layer 41.

By covering the outer peripheral portion of the surface of the electrode pad 25 located on the side where the terminal 12 is provided, that is, by covering the outer peripheral portion of the surface 41A of the metal layer 41, it is possible to suppress delamination from being generated between the side surface of the electrode pad 25 and the side surface of the insulator layer 21. As a result, the reliability of the wiring board 11 can be improved.

For example, the width of the outer peripheral portion of the surface 41A of the metal layer 41 covered by the insulator layer 21 may preferably be 0.1 μm to 6 μm, and more preferably be 1 μm to 3 μm.

The opening 37 has a shape that widens from the electrode pad 25 towards the electronic component 13. Because the shape of the opening 37 widens from the electrode pad 25 towards the electronic component 13, that is, towards the surface 21A of the insulator layer 21, it is possible to easily provide the terminal 12 within the opening 37.

In a case where the metal layer 41 has a diameter of 100 μm, the diameter of the opening 37 at the portion connecting to the metal layer 41 can be 80 μm to 90 μm. For example, the depth of the opening 37 may preferably be 1 μm to 30 μm, and more preferably be 20 μm.

The opening 38 is provided in the insulator layer 21 at a portion making contact with the insulator layer 22. The opening 38 exposes a surface 42A of a metal layer 42 forming the electrode pad 25. The surface 42A of the metal layer 42 forms the first surface of the electrode pad 25.

The insulator layer 22 is provided between the insulator layer 21 and the insulator layer 23. The insulator layer 22 contacts a surface 21B of the insulator layer 21 and a surface 23A of the insulator layer 23. A wiring part 45 forming the conductor pattern 27 and a via part 48 forming the conductor pattern 28 are embedded in the insulator layer 22. The insulator layer 22 has openings 47 that expose portions of the wiring part 45.

The insulator layer 23 is provided on a surface 22B of the insulator layer 22. A wiring part 49 and the vias 31 are embedded in the insulator layer 23. The insulator layer 23 has openings 52 exposing portions of the wiring part 49.

For example, the insulator layers 21, 22 and 23 may be made of a resin material. For example, the resin material includes epoxy resins, polyimide resins and the like. The insulator layers 21, 22 and 23 may be made of the same material or, at least two of the insulator layers 21, 22 and 23 may be made of mutually different materials.

The electrode pad 25 has a stacked structure formed by the first metal layer 41 connected to the terminal 12, and the second metal layer 42 connected to the conductor pattern 27. For example, the metal layer 41 may be formed by a Au layer having a thickness of 0.005 μm or greater and preferably a thickness of 0.04 μm. For example, the metal layer 42 may be formed by a Ni layer having a thickness of 1 μm to 10 μm, and preferably a thickness of 5 μm. When the metal layer 41 is formed by the Au layer and the metal layer 42 is formed by the Ni layer, a Pd layer (not shown) having a thickness of 0.005 μm or greater, for example, may be provided between the metal layers 41 and 42. When using the electrode pads 25 to mount the electronic component 13 on the wiring board 11, the electrode pads 25 may have a diameter of 50 μm to 150 μm, for example.

The conductor pattern 27 includes the via parts 44, and the wiring part 45 which is integrally formed on the via parts 44. The via part 44 is provided in the opening 38. The via part 44 is connected to the metal layer 42. The wiring part 45 is provided on the surface 21S of the insulator layer 21. For example, Cu may be used as a metal material forming the conductor pattern 27.

The conductor pattern 28 includes the via parts 48, and the wiring part 49 which is integrally formed on the via parts 48. The via part 48 is provided in the opening 47. The via part 48 is connected to the wiring part 45. The wiring part 49 is provided on the surface 22S of the insulator layer 22. For example, Cu may be used as a metal material forming the conductor pattern 28.

The via 31 is provided in the opening 52. The via 31 is connected to the wiring part 49. The vias 31 are integrally formed on the pads 32.

The pad 32 is provided on the surface 23S of the insulator layer 23, and is connected to the via 31. The pad 32 has a connection surface 32A. For example, the pad 32 is electrically connected to a circuit board (not shown) such as a mother board. When using the pad 32s to make electrical connection to the circuit board, the pads 32 may have a diameter of 200 μm to 1000 μm, for example.

For example, Cu may be used as a material forming the via 31 and the pad 32.

The solder resist layer 34 is provided on the surface 23B of the insulator layer 23. The solder resist layer 34 has openings 34A that expose the connection surface 32A of the pad 32.

The electronic component 13 is mounted on the wiring board 11 via the terminals 12 and the electrode pads 25. For example, the electronic component 13 may be formed by a semiconductor chip.

According to the wiring board of this first embodiment, the insulator layer 21 covers the outer peripheral portion of the surface of the electrode pad 24 on the side where the terminal 12 is provided, that is, the surface 41A of the metal layer 41. Hence, it is possible to suppress the generation of delamination between the side surface of the electrode pad 25 and the side surface of the insulator layer 21, and the reliability of the wiring board 11 can be improved.

In addition, according to the semiconductor device of this first embodiment, the reliability of the electrical connection between the wiring board 11 and the electronic component 13 can be improved due to the provision of the wiring board 11 having the structure described above.

FIGS. 3 through 12 are cross sectional views for explaining fabrication processes of the semiconductor device in this first embodiment of the present invention. In FIGS. 3 through 12, those parts that are the same as those corresponding parts of the semiconductor device 10 illustrated in FIG. 2 are designated by the same reference numerals.

A description will now be given of the method of fabricating the semiconductor device 10 of this first embodiment, by referring to FIGS. 3 through 12. First, in a fabrication process or step (hereinafter simply referred to as a process) illustrated in FIG. 3, a resist layer 56 having openings 56A is formed on a surface 55A of a support plate 55 that is made of a first metal. The opening 56A is formed to expose the surface 55A of the support plate 55 in a portion corresponding to a region where the electrode pad 25 is formed. For example, the support plate 55 may be formed by a metal foil, a metal plate or the like. The first metal may be Cu, for example. When Cu is used for the first metal, the thickness of the support plate 55 may be 35 μm to 250 μm, for example.

Figure 4:
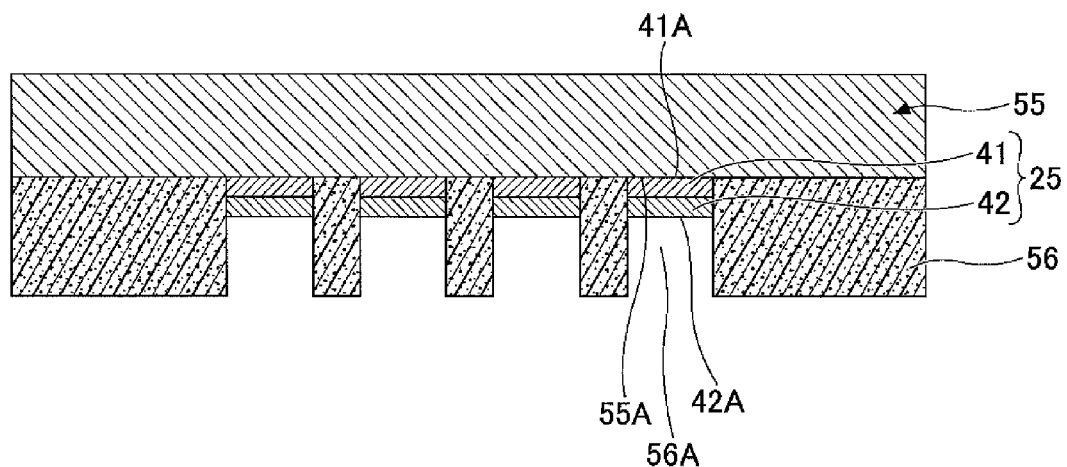

Next, in an electrode pad forming process illustrated in FIG. 4, the first metal layer 41 and the second metal layer 42 are successively stacked on the surface 55A of the support plate 55 exposed at the openings 56A, by electroplating using the support plate 55 as a feed layer, to thereby form the electrode pads 25. The metal layer 41 is formed by a first metal layer forming process, and the metal layer 42 is formed by a second metal layer forming process.

For example, the metal layer 41 may be formed by a Au layer having a thickness of 0.005 μm or greater. When the Au layer is used for the metal layer 41, the metal layer 42 may be formed by a Ni layer having a thickness of 1 μm to 10 μm, for example.

When mounting the electronic component 13 on the wiring board 11 using the electrode pads 25, the electrode pads 25 may have a diameter of 50 μm to 150 μm, for example. When the metal layer 41 is formed by the Au layer and the metal layer 42 is formed by the Ni layer, a Pd layer (not shown) having a thickness of 0.005 μm or greater, and preferably 0.02 μm, for example, may be formed between the metal layers 41 and 42 by electroplating.

Figure 5:
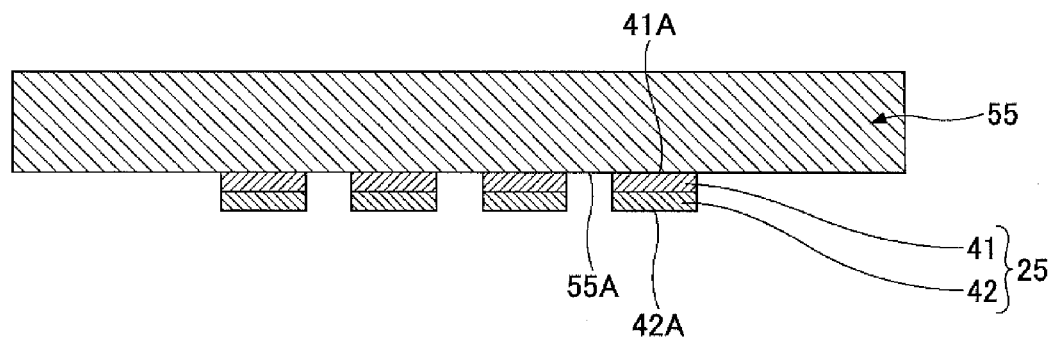
Figure 6:
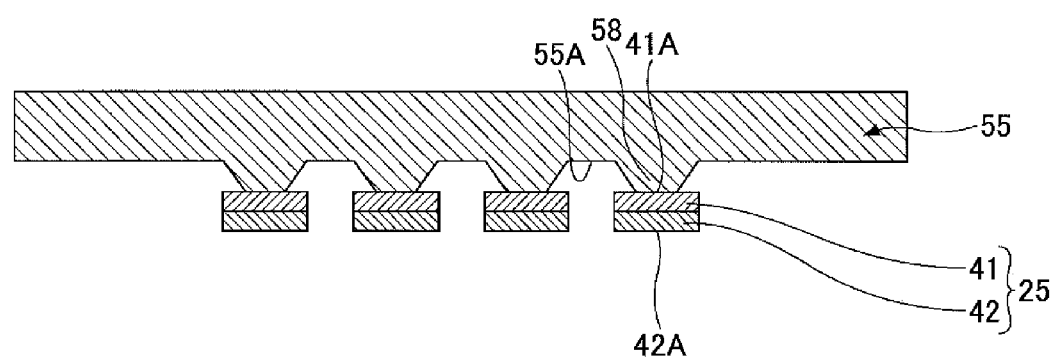

In a process illustrated in FIG. 5, the resist layer 56 in FIG. 4 is removed. Then, in a projecting part forming process illustrated in FIG. 6, a portion of the support plate 55 in FIG. 5 located on the side formed with the electrode pads 25 is etched, so as to etch the surface 55A of the support plate 55 and form projecting parts 58 which make contact with the surface 41A of the metal layer and exposes the outer peripheral portion of the surface 41A of the metal layer. More particularly, the support plate 55 which is made of the first metal is selectively etched using an etchant which does not etch the metal layers 41 and 42.

By carrying out an isotropic wet etching using the electrode pads 25 as a mask, it is possible to expose the outer peripheral portion of the surface 41A of the metal layer 41 from the projecting parts 58, utilizing the side etching and undercut with respect to the support plate 55 achieved by the etchant. In addition, it is possible to prevent the electrode pads 25 from being etched, by selectively etching the support plate 55.

The projecting part 58 has a shape which widens from the electrode pad 25 towards the support plate 55. For example, the projecting part 58 may have a truncated cone shape. In this case, in the cross sectional view, the side surface of the projecting part 58 having the truncated cone shape may be curved inwards in a gull-wing shape relative to a center axis of the truncated cone shape. The shape of the projecting part 58 is approximately the same as the shape of the opening 37 described above in conjunction with FIG. 2.

In a case where the diameter of the metal layer 41 is 100 μm, the diameter of the projecting part 58 at a portion contacting the metal layer 41 may be 80 μm to 90 μm, for example. In this case, the height of the projecting part 58 in a direction in which the layers are stacked may be 1 μm to 30 μm.

Figure 7:
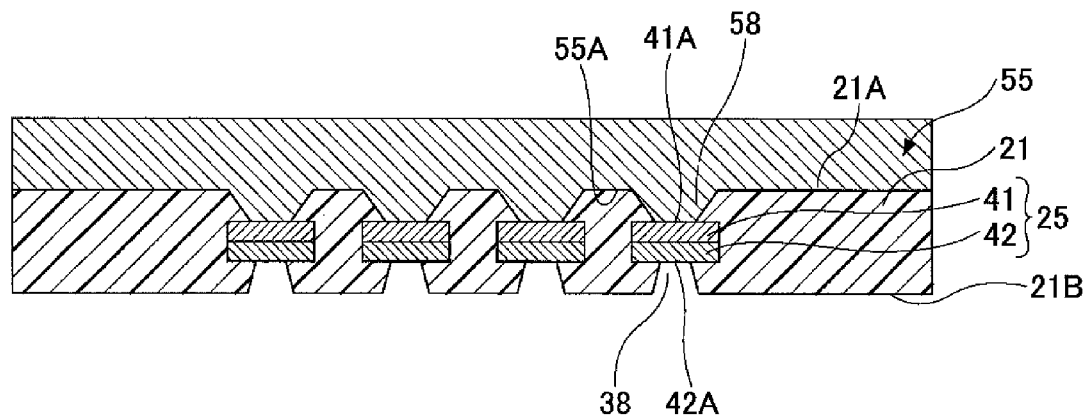

Next, in an insulator layer forming process illustrated in FIG. 7, the insulator layer 21 having the openings 38 is formed so as to cover the electrode pads 25, the projecting parts 58, and the surface 55A of the support plate 55. The insulator layer 21 may be formed by stacking a resin film made of an epoxy resin, a polyimide resin or the like or, by coating a resin.

As a result, the outer peripheral portion of the surface of the electrode pad 25 located on the side where the terminal 12 is provided, that is, the surface 41A of the metal layer 41, is covered by the insulator layer 21. For this reason, it is possible to suppress delamination from being generated between the side surface of the electrode pad 25 and the side surface of the insulator layer 21, and the reliability of the wiring board 11 can be improved.

The width of the outer peripheral portion of the surface 41A of the metal layer 41 covered by the insulator layer 21 may be 0.1 μm to 6 μm, and preferably 1 μm to 3 μm, for example.

The opening 38 is formed in a portion of the insulator layer 21 opposing the surface 42A of the metal layer 42, to expose the surface 42A of the metal layer 42. For example, the opening 38 may be formed by laser beam machining. The thickness of the portion of the insulator layer 21 provided on the surface 55A of the support plate 55 may be 55 μm to 60 μm, for example.

Figure 8:
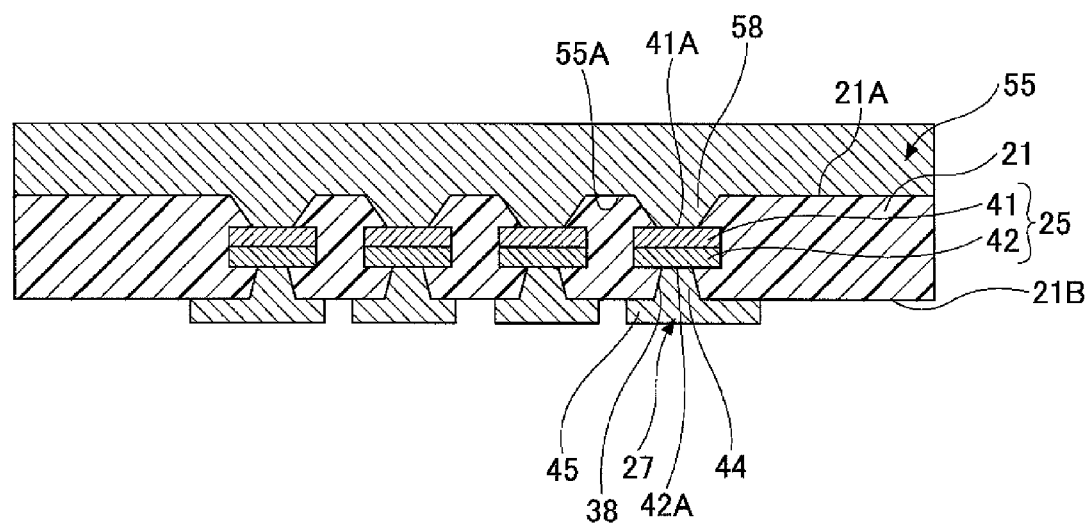

Next, in a conductor pattern forming process illustrated in FIG. 8, the conductor pattern 27 is formed in the openings 38 and on the surface 218 of the insulator layer 21 by a semiadditive method. Hence, the via part 44 formed in the opening 38 is connected to the second metal layer 42. The via part 44 penetrates the portion of the insulator layer 21 opposing the electrode pad 25 on the side where the projecting part 58 is not formed. For example, Cu may be used as a material forming the conductor pattern 27.

Figure 9:
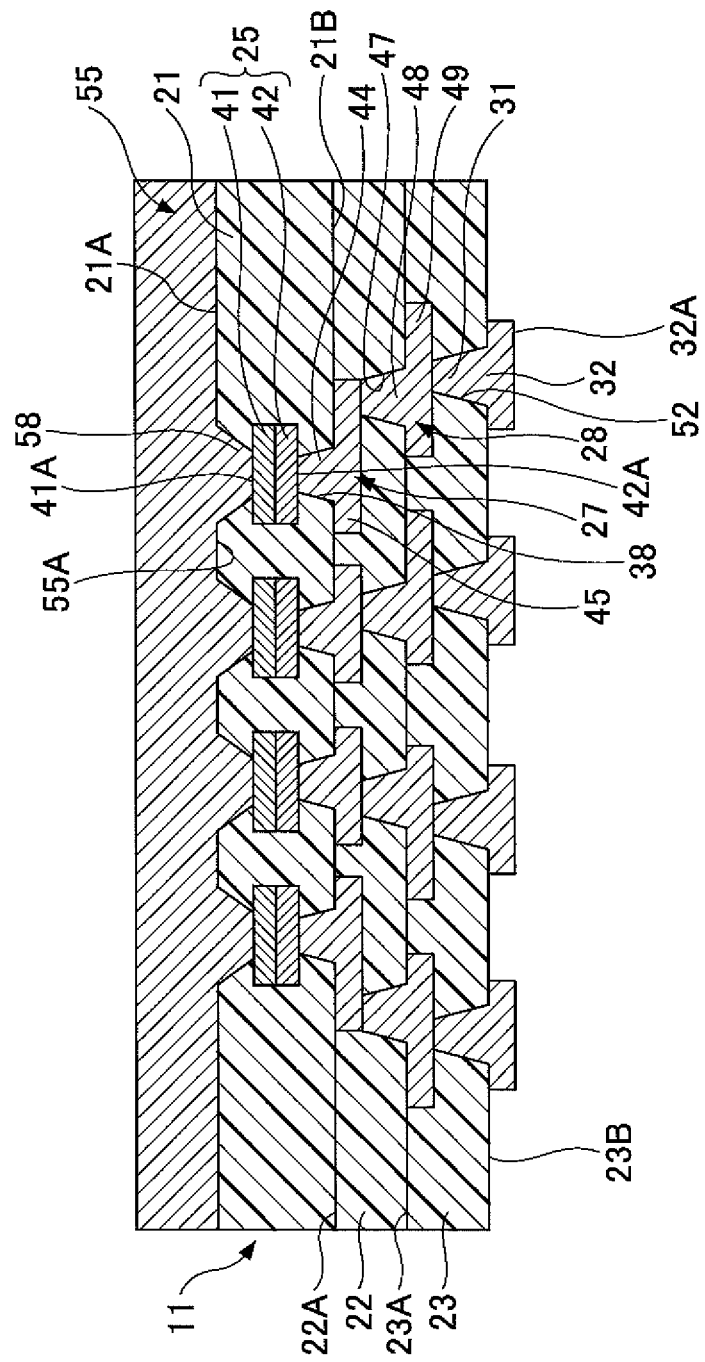

Next, in a process illustrated in FIG. 9, processes similar to the processes described above in conjunction with FIGS. 7 and 8 are repeated, in order to form the insulator layers 22 and 23, the conductor pattern 28, the vias 31, and the pads 32. For example, each of the insulator layers 22 and 23 may be formed by a resin material. In this case, the resin material may be epoxy resins, polyimide resins or the like, for example. When the insulator layers 22 and 23 are made of a resin, the thickness of each of the insulator layers 22 and 23 may be 25 μm to 40 μm, for example. For example, Cu may be used for the conductor pattern 28, the vies 31, and the pads 32. In a case where the pad 32 has a circular shape in a plan view, the diameter of the pad 32 may be 200 μm to 1000 μm, for example.

Figure 10:
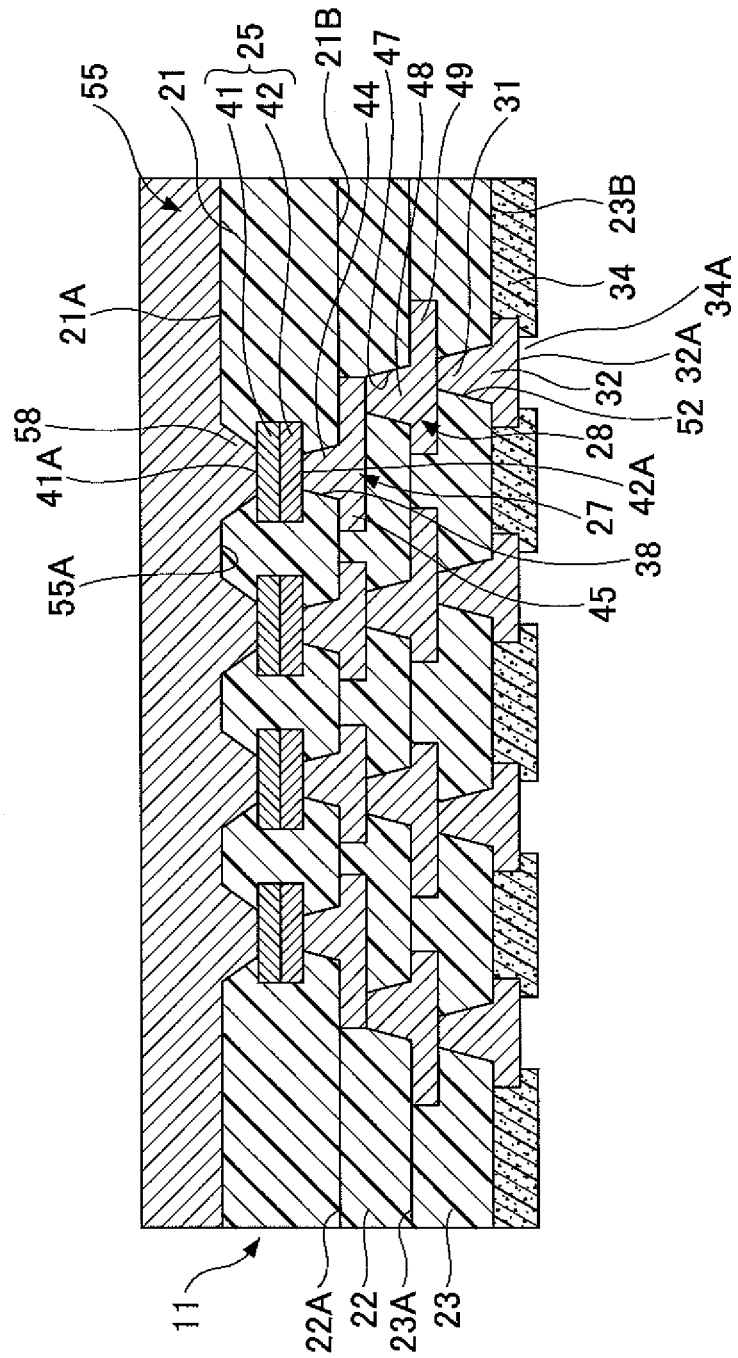

Next, in a process illustrated in FIG. 10, the solder resist layer 34 having the openings 34A which expose the connection surface 32A of the pads 32 is formed on the surface 23B of the insulator layer 23 by a known method. Hence, a structure corresponding to the wiring board 11 is formed on the support plate 55.

Figure 11:
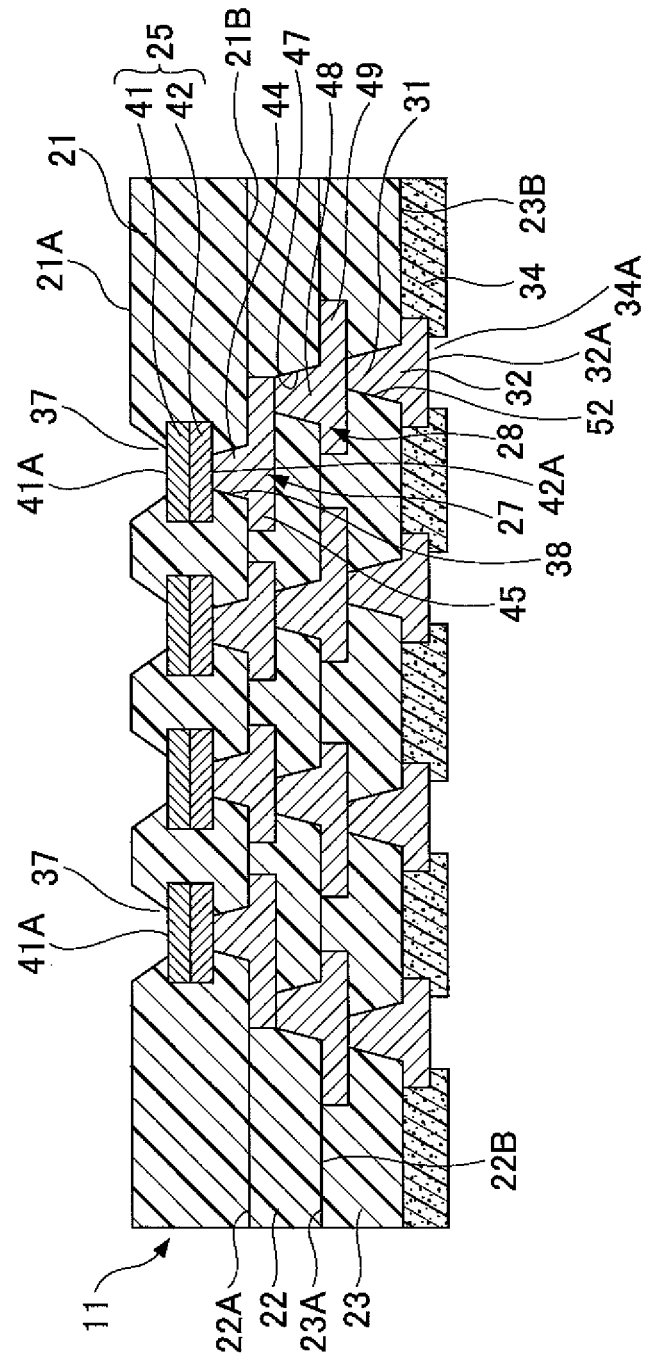

Next, in a support plate removing process illustrated in FIG. 11, the support plate 55 formed with the projecting parts 58 illustrated in FIG. 10 is removed by etching. Consequently, the surface 41A of the metal layer 41 is exposed, and the openings 37 having the shapes corresponding to the shapes of the projecting parts 58 are formed. More particularly, the support plate 55 formed with the projecting parts 58 is removed using an etchant which selectively etches the support plate 55 but does not etch the electrode pads 25. As a result, the wiring board 11 of this first embodiment is fabricated. The depth of the opening 37 may be 1 μm to 30 μm, and preferably 20 μm, for example.

Figure 12:
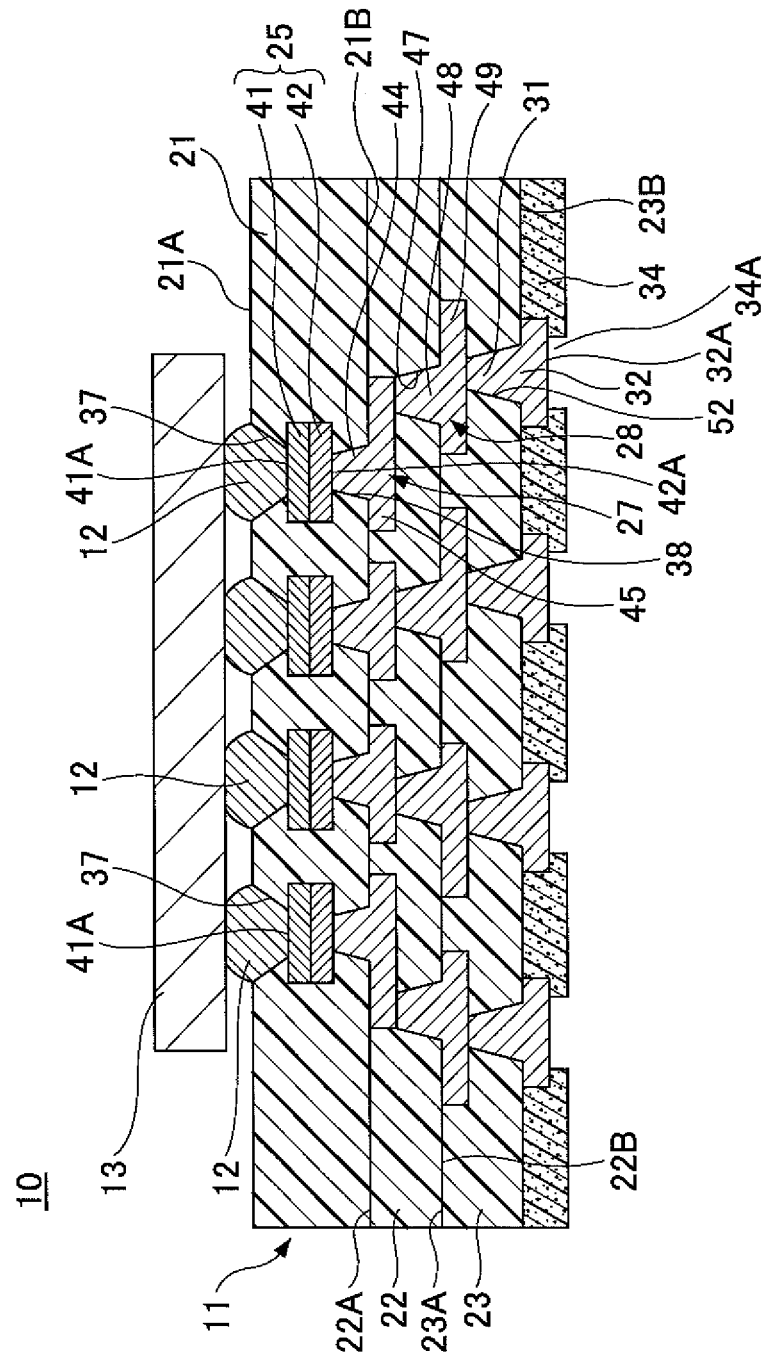

Next, in a process illustrated in FIG. 12, the electronic component 13 is mounted on the wiring board 11 via the terminals 12 and the electrode pads (or the metal layer 41). Thus, the semiconductor device 10 of this first embodiment, provided with the electronic component 13 and the wiring board 11, is fabricated.

According to the method fabricating the wiring board of this first embodiment, the support plate 55 is etched to form, at the portion of the support plate 55 confronting the electrode pad 25, the projecting part 58 which exposes the outer peripheral portion of the surface (surface 41A of the metal layer 41) of the electrode pad 25 on the side confronting the support plate. Thereafter, the insulator layer 21 is formed to cover the electrode pad 25, the projecting part 58, and the surface 55A of the support plate 55 on the side formed with the electrode pad 25. Hence, the insulator layer 21 is formed on the surface (surface 41A of the metal layer 41) of the electrode pad 25 on the side opposing the support plate 55, and the generation of delamination between the side surface of the electrode pad 25 and the side surface of the insulator layer 21 is suppressed, to thereby improve the reliability of the wiring board 11.

FIGS. 13 through 16 are cross sectional views for explaining other fabrication processes of the semiconductor device in the first embodiment of the present invention, that may be used to fabricate the semiconductor device in the first embodiment. In FIGS. 13 through 16, those parts that are the same as those corresponding parts of the structure illustrated in FIG. 4 and the semiconductor device 10 of the first embodiment illustrated in FIG. 2 are designated by the same reference numerals.

A description will be given of the other fabrication processes that may be used to fabricate the semiconductor device 10 of this first embodiment, by referring to FIGS. 13 through 16. First, a process similar to the process of the first embodiment described above in conjunction with FIG. 3 is carried out to form the structure illustrated in FIG. 3.

Figure 13:
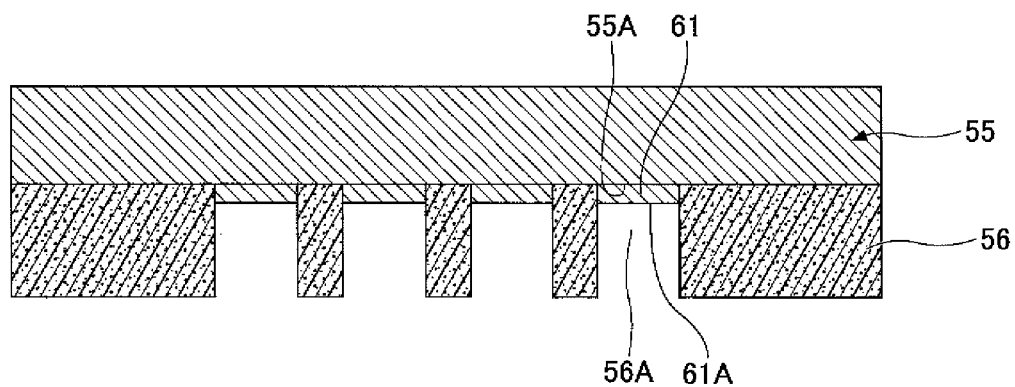
FIGS. 13 through 16 are cross sectional views for explaining other fabrication processes of the semiconductor device in the first embodiment of the present invention.

Next, in a height adjusting layer forming process illustrated in FIG. 13, a height adjusting layer 61 made of the first metal (metal forming the support plate 55) is formed on the surface 55A of the support plate 55 at portions corresponding to regions where the electrode pads 25 are formed, prior to forming the electrode pads 25. The height adjusting layer 61 may be formed by electroplating using the support plate 55 as a feed layer. For example, Cu may be used for the first metal. When Cu is used for the first metal, the Cu layer forming the height adjusting layer 61 may have a thickness of 5 μm to 15 μm, for example.

Figure 14:
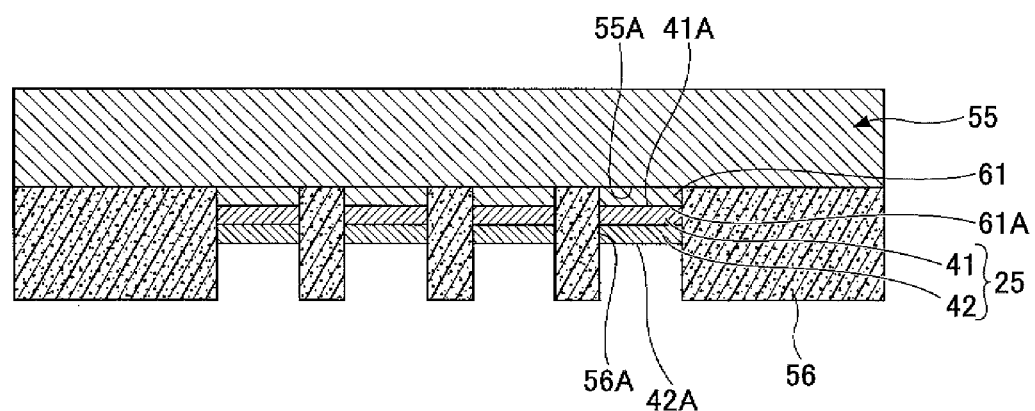

Next, in a process illustrated in FIG. 14, a process similar to the process described above in conjunction with FIG. 4 is carried out to successively form the metal layer 41 and the metal layer 42 on a surface 61A of the height adjusting layer 61.

Figure 15:
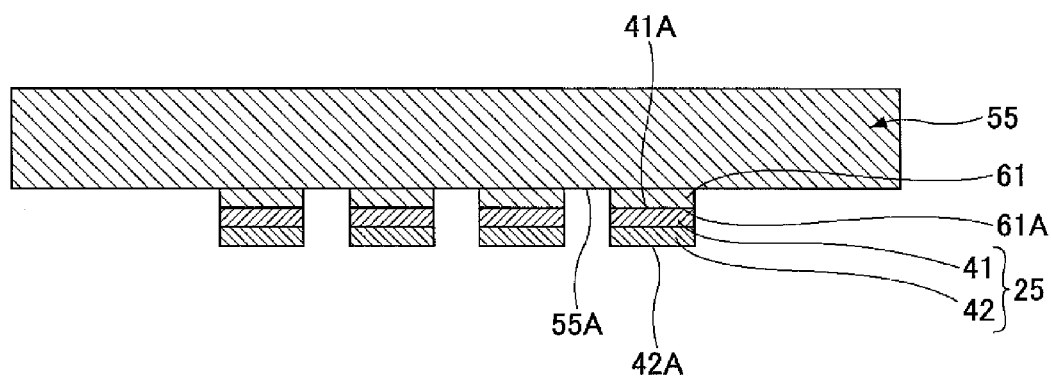
Figure 16:
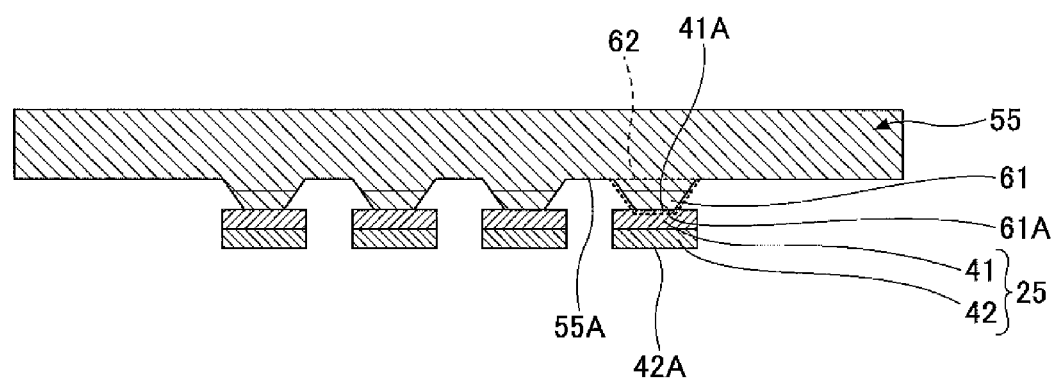

Next, in a process illustrated in FIG. 15, the resist layer 56 in FIG. 14 is removed. Then, in a projecting part forming process illustrated in FIG. 16, the portions of the support plate 55 located on the side where the electrode pads 25 are formed and the height adjusting layer 61 are etched, to etch the surface 55A of the support plate 55 and the sidewall of the height adjusting layer 61. As a result, projecting parts 62 which contact the surface 41A of the metal layer 41 and expose the outer peripheral portion of the surface 41A of the metal layer 41 are formed. The projecting part 62 is made up of a portion of the support plate 55 and the height adjusting layer 61 that remains after the etching. More particularly, in the projecting part forming process, an etchant which selectively etches the support plate 55 and the height adjusting parts 61 that are respectively made of the first metal, and does not etch the metal layers 41 and 42, is used to etch the support plate 55 and the height adjusting layer 61.

Thereafter, processes similar to the processes described above in conjunction with FIGS. 7 through 12 are carried out, to fabricate the semiconductor device 10 of this first embodiment.

According to the method of fabricating the semiconductor device of this first embodiment utilizing the other fabrication processes, the height adjusting layer 61 made of the first metal is formed on the support plate 55 so that the height adjusting layer 61 will be interposed between the support plate 55 and the electrode pads 25 formed thereafter, and the electrode pads 25 are then formed on the height adjusting layer 61. In addition, the portions of the support plate 55 where the electrode pads 25 are formed and the height adjusting layer 61 are etched, in order to reduce the amount of etching or the etching time required to form the projecting parts 62. Hence, compared to the case where no height adjusting layer 61 is formed, it is possible to reduce the fabrication cost of the wiring board 11.

Figure 17:
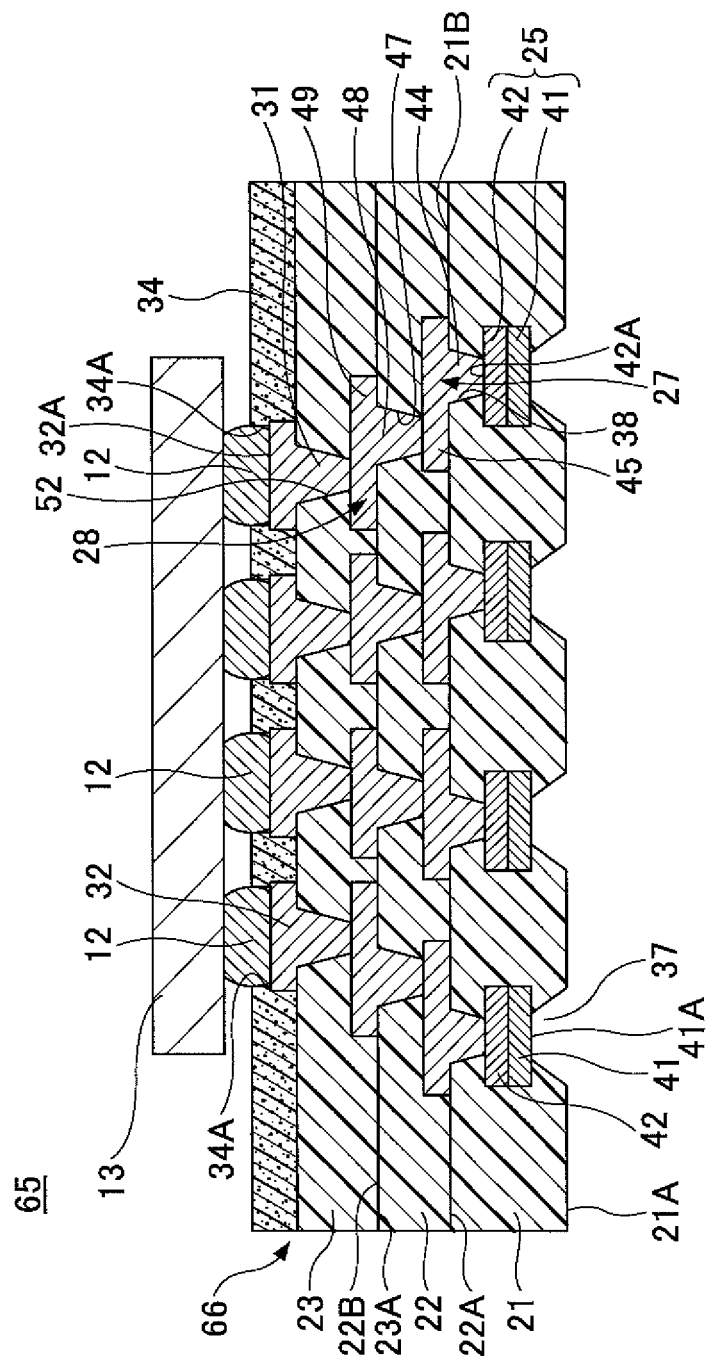
FIG. 17 is a cross sectional view illustrating the semiconductor device in a modification of the first embodiment of the present invention.

FIG. 17 is a cross sectional view illustrating the semiconductor device in a modification of the first embodiment of the present invention. In FIG. 17, those parts that are the same as those corresponding parts of the semiconductor device 10 of the first embodiment illustrated in FIG. 2 are designated by the same reference numerals.

As illustrated in FIG. 17, a semiconductor device 65 in this modification of the first embodiment is provided with a wiring board 66, in place of the wiring board 11 provided in the semiconductor device 10 of the first embodiment. Otherwise, the structure of the semiconductor device 65 is basically the same as that of the semiconductor device 10.

The wiring board 66 includes pads 32 for use in mounting the electronic component 13 on the wiring board 66, and electrode pads 25 for use in making electrical connections to a circuit board (not shown) such as a mother board. In this case, the diameter of the pad 32 may be 50 µm to 150 µm, for example. Further, the diameter of the electrode pad 25 may be 200 µm to 1000 µm, for example.

The wiring board 66 of this modification of the first embodiment can obtain effects similar to those obtainable by the wiring board 11 of the first embodiment. In addition, the wiring board 66 can be fabricated by processes similar to those used to fabricate the wiring board 11, and the effects obtainable by the fabrication processes of the wiring board 66 are similar to those obtainable by the fabrication processes of the wiring board 11.

The semiconductor devices 10 and 65 have the Land Grid Array (LGA) structure in which the pads themselves on the side connecting to the circuit board (not shown) function as terminals for external connection. However, the semiconductor devices 10 and 65 may have the Ball Grid Array (BGA) structure in which the pads connect to solder balls or, the Pin Grid Array (PGA) structure in which the pads connect to pins.

Second Embodiment

Figure 18:
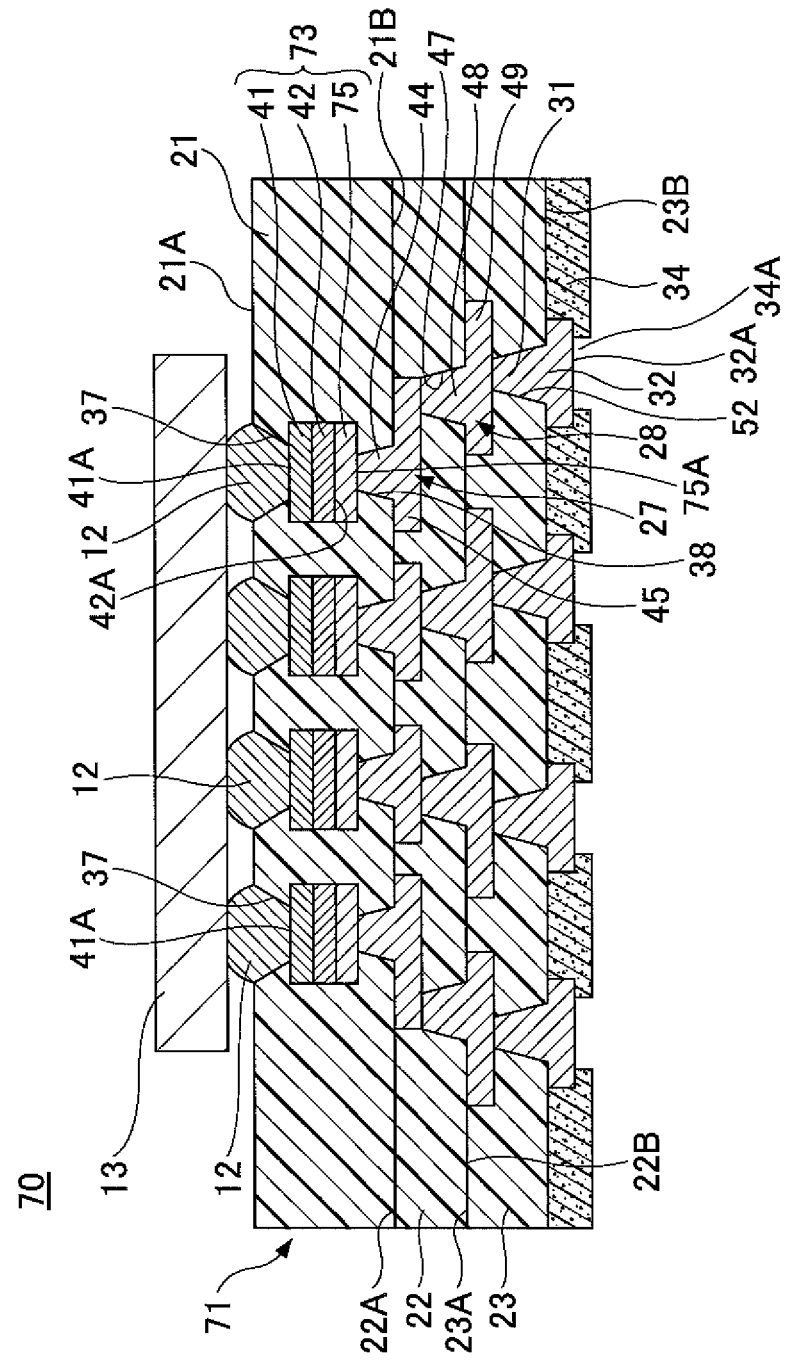
FIG. 18 is a cross sectional view illustrating the semiconductor device in a second embodiment of the present invention.

FIG. 18 is a cross sectional view illustrating the semiconductor device in a second embodiment of the present invention. In FIG. 18, those parts that are the same as those corresponding parts of the semiconductor device 10 of the first embodiment illustrated in FIG. 2 are designated by the same reference numerals.

As illustrated in FIG. 18, a semiconductor device 70 in this second embodiment is provided with a wiring board 71, in place of the wiring board 11 provided in the semiconductor device 10 of the first embodiment. Otherwise, the structure of the semiconductor device 70 is basically the same as that of the semiconductor device 10.

The wiring board 71 is provided with electrode pads 73, in place of the electrode pads 25 provided in the wiring board 11. Otherwise, the structure of the wiring board 71 is basically the same as that of the wiring board 11.

The electrode pad 73 includes, in addition to the structure of the electrode pad 25, a third metal layer 75 which covers the surface 42A of the second metal layer 42. Otherwise, the structure of the electrode pad 73 is basically the same as that of the electrode pad 25.

A surface 75A of the metal layer 75, located on the side opposite to the side connecting to the metal layer 42, is exposed at the opening 38 formed in the insulator layer 21. The metal layer 75 is connected to the conductor pattern 27, that is, the via part 44, provided in the opening 38. Hence, the electrode pads 73 electrically connect the electronic component 13 and the conductor pattern 27.

The metal layer 75 is made of the same metal as the conductor pattern 27, that is, the first metal used in the first embodiment. Preferably, the metal layer 75 is made of a metal which is less easily oxidized than the metal forming the metal layer 42. In a case where Cu is used for the metal forming the conductor pattern 27, Cu, for example, may be used as the metal material forming the metal layer 75. When Cu is used as the metal material forming the metal layer 75, the thickness of the metal layer 75 may be 10 µm to 20 µm, and preferably 15 µm, for example. Cu is less easily oxidized than Ni.

Accordingly, by providing on the surface 42A of the metal layer 42 the metal layer 75 which is less easily oxidized than the metal layer 42, and connecting the metal layer 75 and the via part 44 forming the conductor pattern 27, it is possible to improve the reliability of the electrical connection between the electrode pads 73 and the conductor pattern 27.

In addition, in the case where the metal material forming the conductor pattern 27 is Cu, it is possible to improve the bonding between the via part 44 and the metal layer 75 by using Cu for the metal material forming the metal layer 75. As a result, it is possible to further improve the reliability of the electrical connection between the electrode pads 73 and the conductor pattern 27 in this case.

When the electrode pads 73 are used to mount the electronic component 13 on the wiring board 71, the diameter of the electrode pad 73 may be 50 µm to 150 µm, for example. In this case, the pads 32 connect to a circuit board (not shown) such as a mother board, and the diameter of the pad 32 may be 200 µm to 1000 µm, for example.

Moreover, when the electrode pads 73 are used to connect to the circuit board (not shown) such as the mother board, the diameter of the electrode pad 73 may be 200 µm to 1000 µm, for example. In this case, the electronic component 13 is mounted on the pads 32, and the diameter of the pad 32 may be 50 µm to 150 µm, for example.

According to the wiring board 71 of this second embodiment, the metal layer 75 less easily oxidized than the metal layer 42 is provided on the surface 42A of the metal layer 42, and the metal layer 75 is connected to the via part 44 forming the conductor pattern. Hence, it is possible to improve the reliability of the electrical connection between the electrode pads 73 and the conductor pattern 27.

In a case where the metal layer 41 is formed by a Au layer and the metal layer 42 is formed by a Ni layer, a Pd layer (not shown) may be provided between the metal layers 41 and 42. In this case, the thickness of the Pd layer may be 0.005 µm or greater, and preferably 0.02 µm, for example.

FIGS. 19 through 25 are cross sectional views for explaining fabrication processes of the semiconductor device in this second embodiment of the present invention. In FIGS. 19 through 25, those parts that are the same as those corresponding parts of the semiconductor device 70 illustrated in FIG. 18 are designated by the same reference numerals.

A description will now be given of the method of fabricating the semiconductor device 70 of this second embodiment, by referring to FIGS. 19 through 25. First, a first metal layer forming process and a second metal layer forming process similar to the processes described above in conjunction with FIGS. 3 and 4 of the first embodiment are carried out to form the structure illustrated in FIG. 4.

Figure 19:
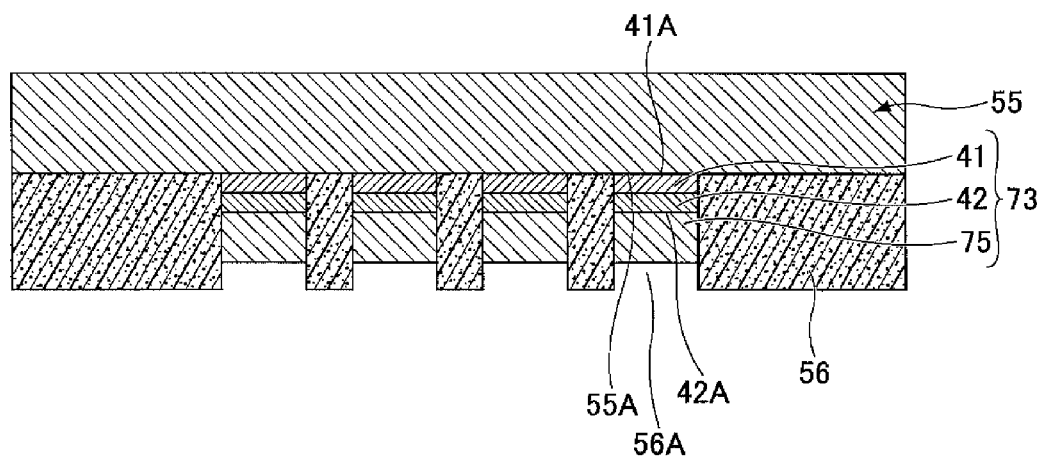
FIGS. 19 through 25 are cross sectional views for explaining fabrication processes of the semiconductor device in the second embodiment of the present invention.

Next, in a third metal layer forming process illustrated in FIG. 19, the third metal layer 75 made of the first metal less easily oxidized than the metal layer 42 is formed on the surface 42A of the metal layer 42 by electroplating using the support plate 55 made of the first metal as a feed layer.

Figure 21:
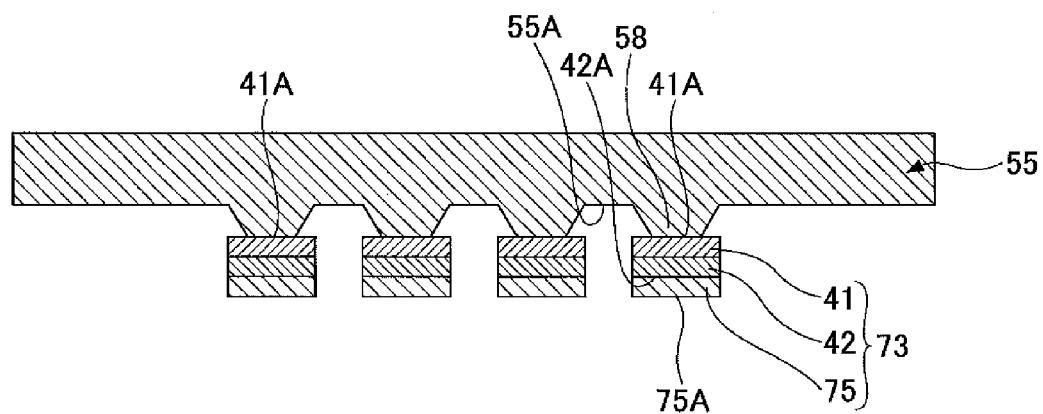

The third metal layer forming process forms the metal layer 75 to have a thickness greater than the thickness of the metal layer 75 illustrated in FIG. 18, so that the metal layer 75 will has a sufficient thickness to cover the surface 42A of the metal layer 42 after a projecting part forming process which will be described later in conjunction with FIG. 21. In other words, the metal layer 75 is formed to a thickness that is a sum of the thickness of the metal layer 75 illustrated in FIG. 18 and an amount or thickness of the metal layer 75 that will be etched during the projecting part forming process, by taking into account the amount of etching made in the projecting part forming process. In a case where the first metal is Cu, the metal layer 75 may have a thickness of 30 µm to 50 µm, for example.

By forming the metal layer 75 to have the thickness greater than that of the metal layer 75 illustrated in FIG. 18 by taking into account the amount of the metal layer 75 etched in the projecting part forming process, it becomes possible to positively connect the metal layer 75 and the via part 44 of the conductor pattern 27. Consequently, the reliability of the electrical connection between the metal layer 75 and the conductor pattern 27 can be improved.

In addition, by using Cu for the metal material forming the conductor pattern 27 and the metal layer 75, it is possible to further improve the reliability of the electrical connection between the metal layer 75 and the conductor pattern 27.

Figure 20:
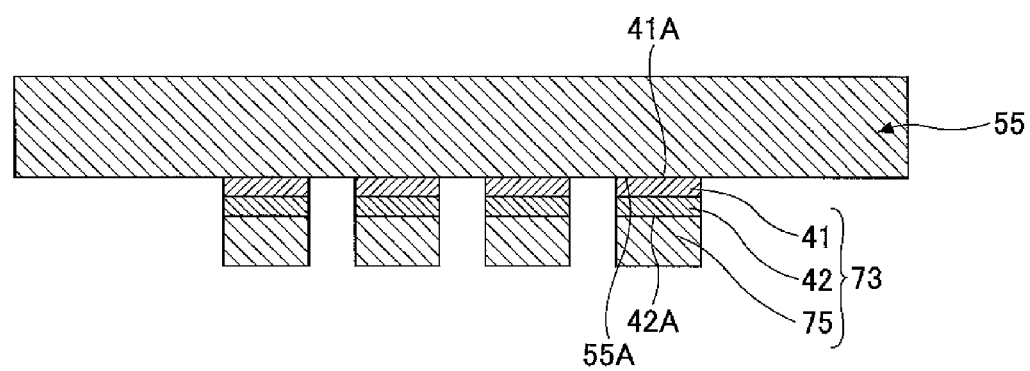

Next, in a process illustrated in FIG. 20, the resist layer 56 in FIG. 19 is removed. Then, in the projecting part forming process illustrated in FIG. 21, a process similar to the process of the first embodiment described above in conjunction with FIG. 6 is carried out to etch a portion of the support plate 55 located on the side formed with the electrode pads 73 in FIG. 20, and the surface 55A of the support plate 55 is etched.

Hence, the projecting part 58 which contacts the surface 41A of the metal layer 41 and exposes the outer peripheral portion of the surface 41A of the metal layer 41 is formed. In this state, the metal layer 75 which is made of the first metal which forms the support plate 55 is also etched. However, the thickness of the metal layer 75 is set in advance in the process described above in conjunction with FIG. 19 by taking into account the amount of the metal layer 75 that will be etched in the projecting part forming process. For this reason, the etching of the metal layer 75 in the projecting part forming process will not cause the surface 42A of the metal layer 42 to become exposed.

In addition, by reducing the thickness of the metal layer 75 by the etching carried out in the projecting part forming process, the electrode pad 73 made up of the metal layers 41, 42 and 75 is formed. The process illustrated in FIG. 4 and FIGS. 19 through 21 correspond to the electrode pad forming process.

When Cu is used for the metal material forming the metal layer 75, the thickness of the metal layer 75 after the projecting part forming process may be 10 µm to 20 µm, and preferably 15 µm, for example.

Figure 22:
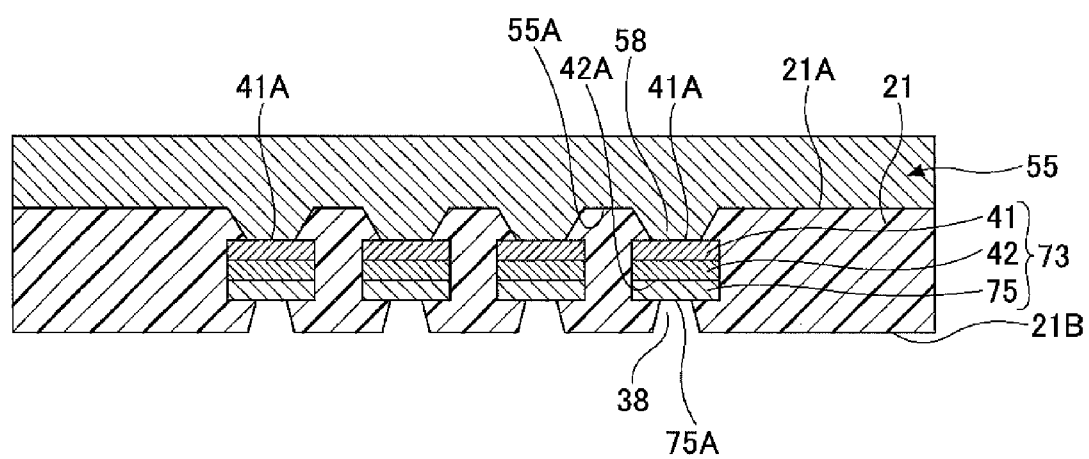

Next, in an insulator layer forming process illustrated in FIG. 22, the insulator layer 21 having the openings 38 is formed to cover the electrode pads 73, the projecting parts 58, and the surface 55A of the support plate 55 located on the side formed with the projecting parts 58.

Hence, the outer peripheral portion of the surface of the electrode pad 73 on the side provided with the terminal 12, that is, the surface 41A of the metal layer 41, is covered by the insulator layer 21. As a result, it is possible to suppress the generation of delamination between the side surface of the electrode pad 73 and the side surface of the insulator layer 21, and to improve the reliability of the wiring board 71.

For example, the thickness of the insulator layer 21 provided on the surface 55A of the support plate 55 may be 65 µm to 75 µm, for example.

Figure 23:
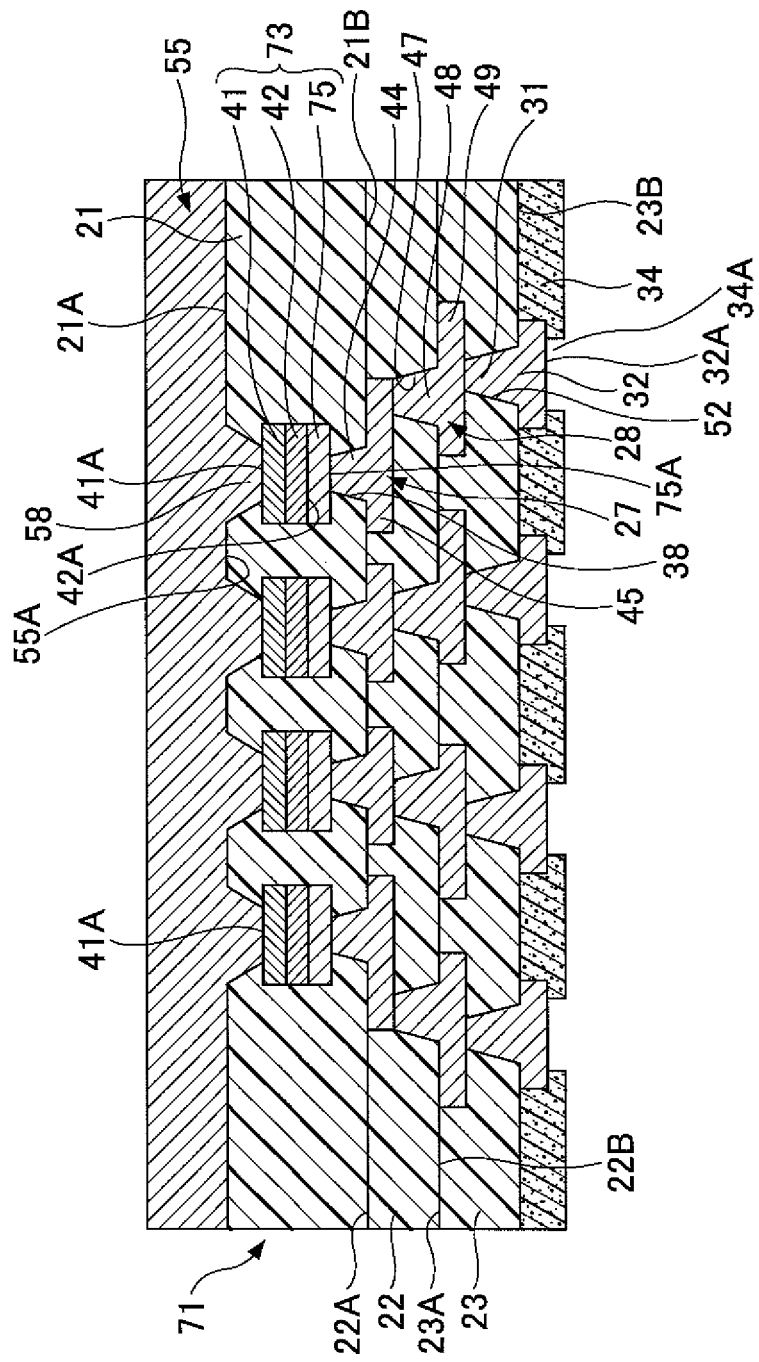

Next, in a process illustrated in FIG. 23, processes similar to the processes of the first embodiment described above in conjunction with FIGS. 8 through 10, including the conductor pattern forming process, are carried out, to form the conductor patterns 27 and 28, the vias 31, the pads 32, and the solder resist layer 34. Hence, a structure corresponding to the wiring board 71 is formed on the support plate 55.

Figure 24:
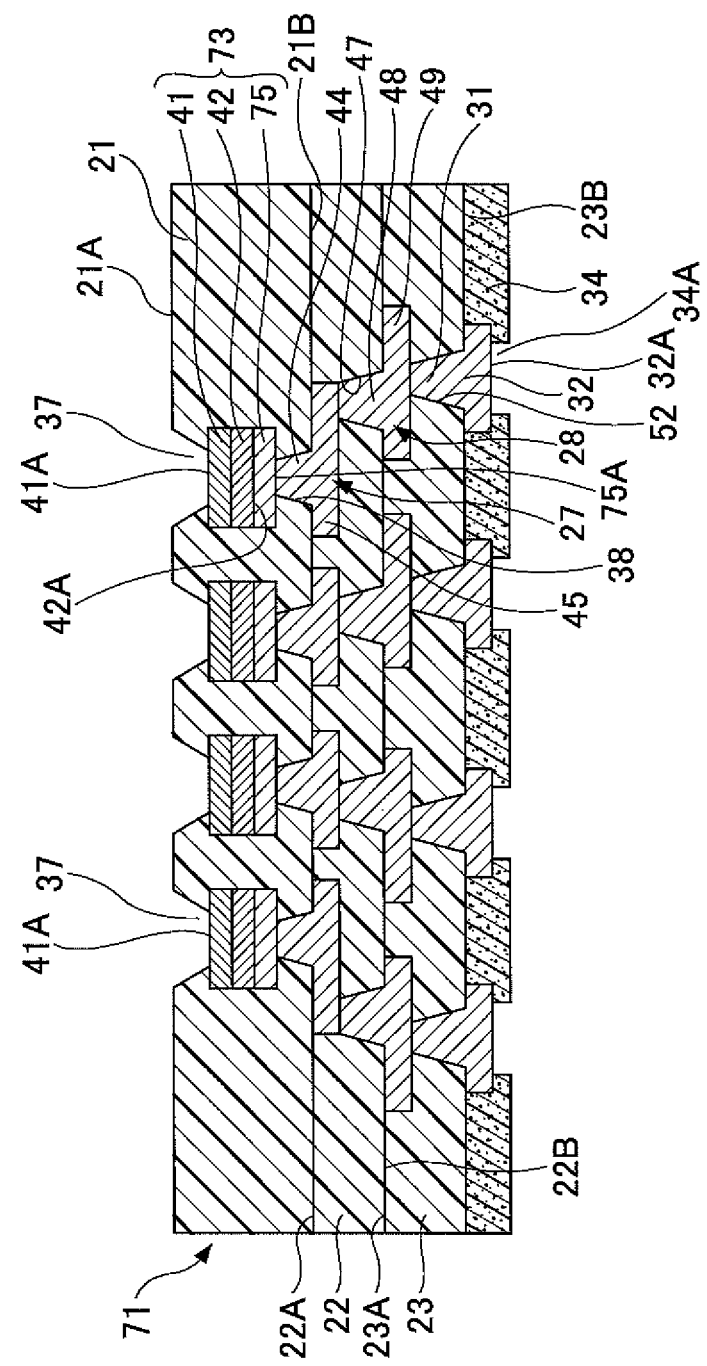

Next, in a support plate removing process illustrated in FIG. 24, the support plate 55 formed with the projecting parts 58 is removed by a process similar to the process of the first embodiment described above in conjunction with FIG. 11. Thus, the openings 37 which expose the surface 41A of the metal layer 41 and have shapes corresponding to the shapes of the projecting parts 58 are formed in the insulator layer 21. As a result, the wiring board 71 of this second embodiment is fabricated.

Figure 25:
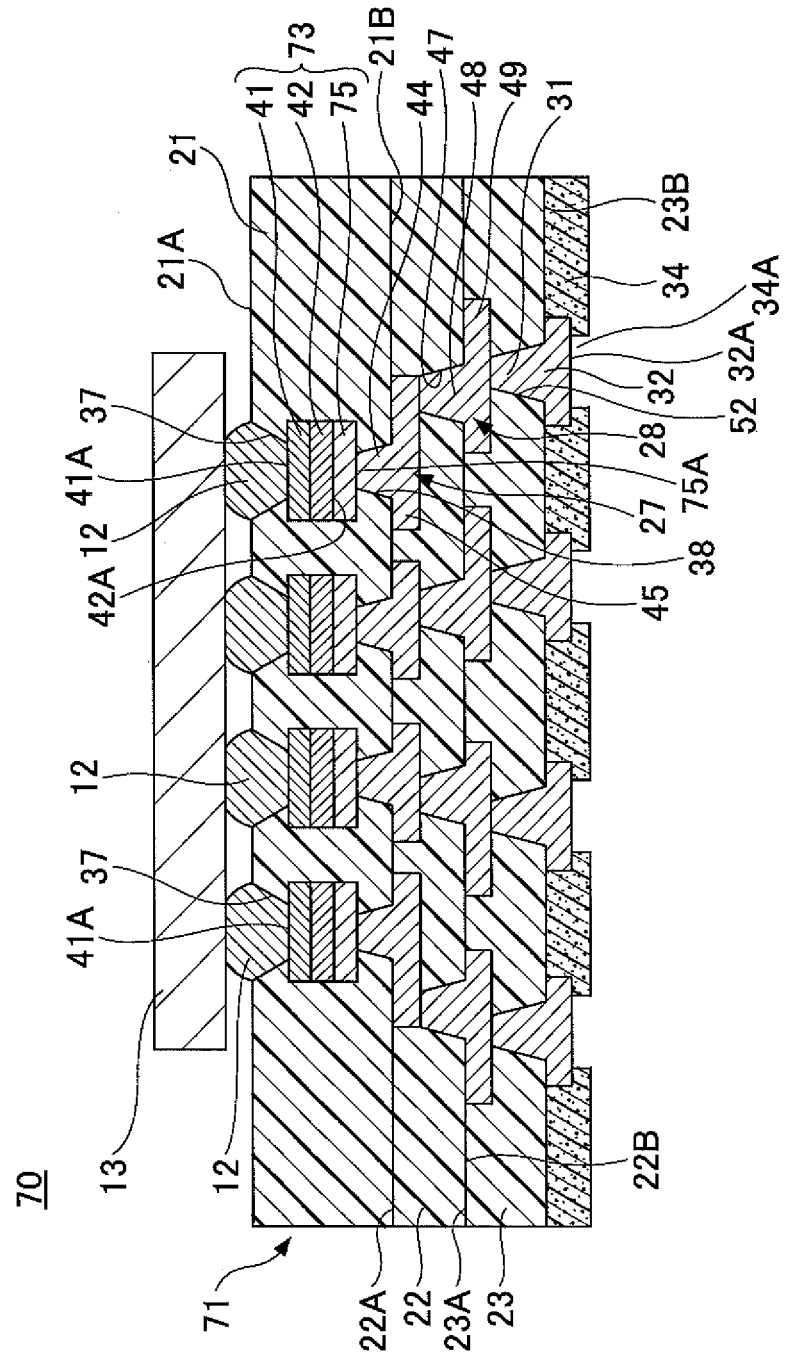

Next, in a process illustrated in FIG. 25, the electronic component 13 is mounted on the wiring board 71 via the terminals 12 and the electrode pads 73 (or metal layer 41). Therefore, the semiconductor device 70 of this second embodiment, including the electronic component 13 and the wiring board 71, is fabricated.

According to the method of fabricating the wiring board 71 of this second embodiment, the metal layer 41 made of a metal different from the first metal is formed on the support plate 55, and the metal layer 42 made of a metal different from the first metal is formed on the metal layer 42, and the metal layer 75 is formed on the surface 42A of the metal layer 42. This metal layer 75 is made of the first metal which is less easily oxidized than the metal layer 42. In addition, this metal layer 75 has a sufficient thickness that will enable the metal layer 75 to cover the surface 42A of the metal layer 42 after the projecting part forming process. Accordingly, it is possible to improve the reliability of the electrical connection between the electrode pads 73 and the conductor pattern 27, because the metal layer 75 which is a constituent element of the electrode pad 73 can be connected to the conductor pattern 27.

FIGS. 26 through 31 are cross sectional views for explaining other fabrication processes of the semiconductor device in this second embodiment of the present invention, that may be used to fabricate the semiconductor device in the second embodiment. In FIGS. 26 through 31, those parts that are the same as those corresponding parts of the semiconductor device 70 of the second embodiment illustrated in FIG. 18 are designated by the same reference numerals.

A description will be given of the other fabrication processes that may be used to fabricate the semiconductor device 70 of this second embodiment, by referring to FIGS. 26 through 31. First, processes similar to the processes of the first embodiment described above in conjunction with FIGS. 3 and 4, including the first metal layer forming process and the second metal layer forming process, are carried out to form the structure illustrated in FIG. 4.

Figure 26:
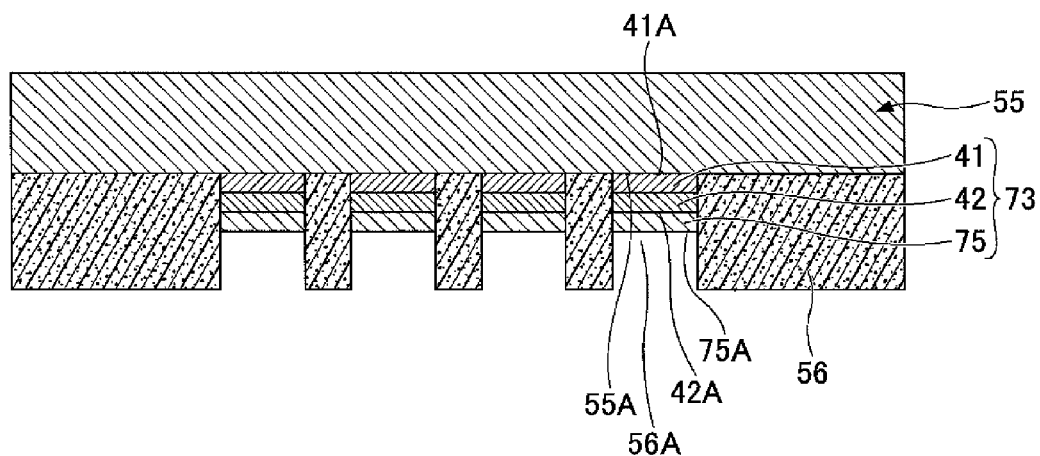
FIGS. 26 through 31 are cross sectional views for explaining other fabrication processes of the semiconductor device in the second embodiment of the present invention.

Next, in a process illustrated in FIG. 26, the third metal layer 75 made of the first metal less easily oxidized than the metal layer 42 is formed on the surface 42A of the metal layer 42 by electroplating using the support plate 55 made of the first metal as a feed layer. Hence, the electrode pads 73 made up of the metal layers 41, 42 and 75 are formed on the surface 55A of the support plate 55. The processes illustrated in FIGS. 4 and 26 correspond to the electrode pad forming process.

For example, Cu may be used for the first meal. When Cu is used for the metal material forming the metal layer 75, the thickness of the metal layer 75 may be 10 μm to 20 μm, and preferably 15 μm, for example.

Figure 27:
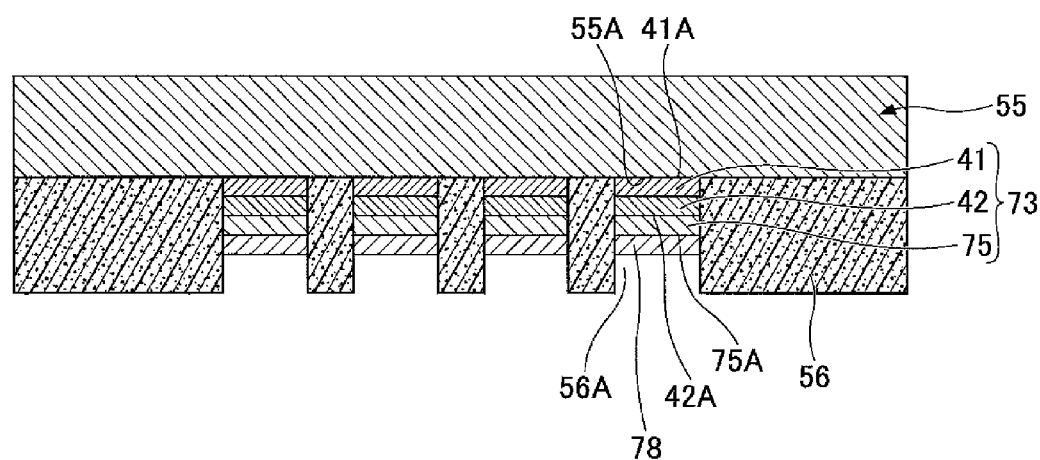

Next, in a protection layer forming process illustrated in FIG. 27, a protection layer 78 is formed on the surface 75A of the metal layer. This protection layer 78 prevents the metal layer 75 from being etched when etching the support plate in a projecting part forming process which will be described later in conjunction with FIG. 29.

The protection layer 78 may be formed by electroplating using the support plate 55 as a feed layer. The protection layer 78 is made of a metal material different from the first metal. For example, a Sn layer, a Sn—Pb layer or the like, formed by electroplating, may be used for the protection layer 78. In this case, the thickness of the protection layer 78 may be 1 μm to 5 μm, for example.

Figure 28:
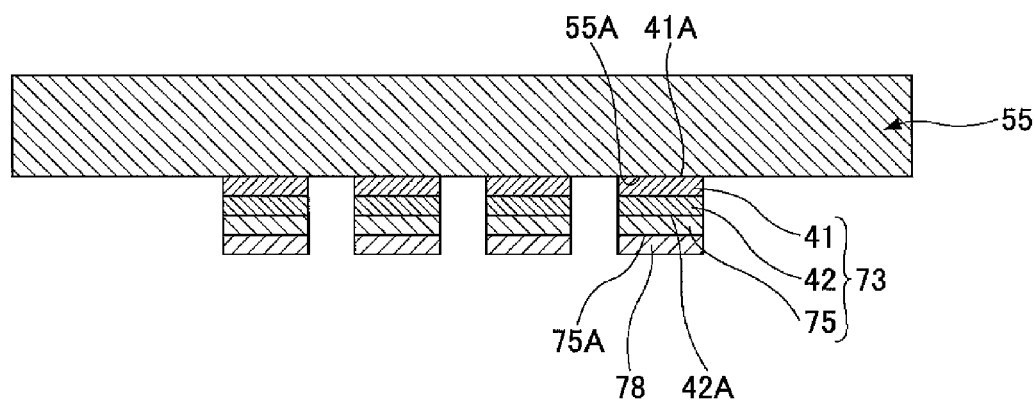

Next in a process illustrated in FIG. 28, the resist layer 56 in FIG. 27 is removed. Then, in the projecting part forming process illustrated in FIG. 29, the portions of the support plate 55 on the side formed with the electrode pads 73 in FIG. 28 are etched, and the surface 55A of the support plate 55 is etched. As a result, the projecting part 58, which contacts the surface 41A of the metal layer 41 and exposes the outer peripheral portion of the surface 41A of the metal layer 41, is formed. More particularly, the support plate 55 is etched using an etchant that selectively etches the support plate 55 made of the first metal but does not etch the metal layers 41 and 42 and the protection layer 78.

By carrying out an isotropic wet etching using the electrode pads 73 as a mask, it is possible to expose the outer peripheral portion of the surface 41A of the metal layer 41 from the projecting parts 58, utilizing the side etching and undercut with respect to the support plate 55 achieved by the etchant.

In addition, the protection layer 78 which is made of the metal different from the first metal is formed on the surface 75A of the metal layer 75 which is made of the first metal forming the support plate 55, and the projecting parts 58 are formed on the support plate 55 by etching the support plate 55. For this reason, it is possible to prevent the metal layer 75 from being etched in the projecting part forming process.

Figure 29:
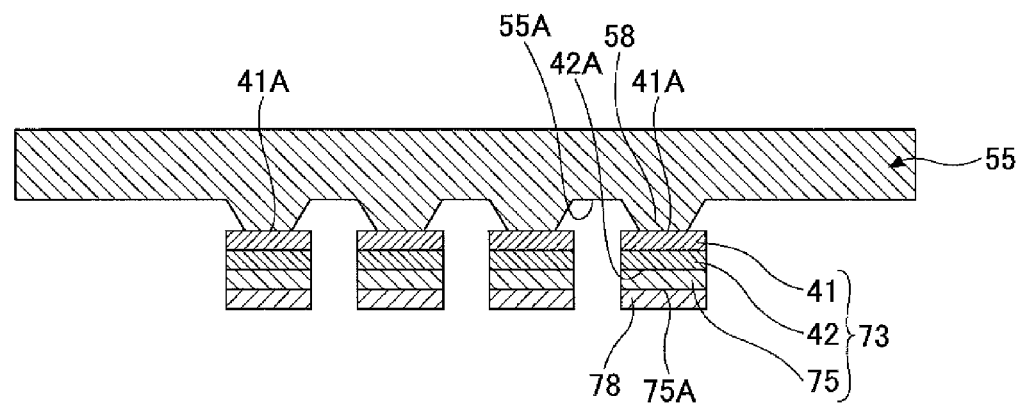
Figure 30:
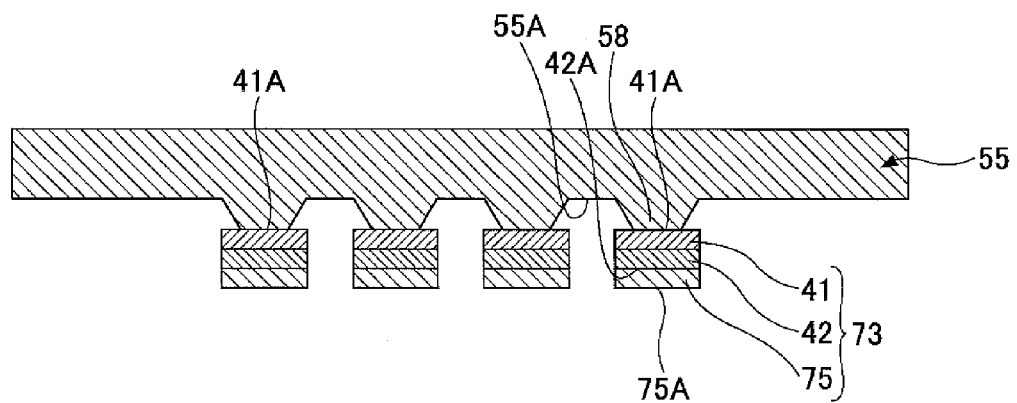

Next, in a protection layer removing process illustrated in FIG. 30, the protection layer 78 is removed using an etchant, such as a fluorine-hydrogen-peroxide system etchant, which removes only the protection layer 78 in FIG. 29. As a result, the surface 75A of the metal layer 75 is exposed.

Figure 31:
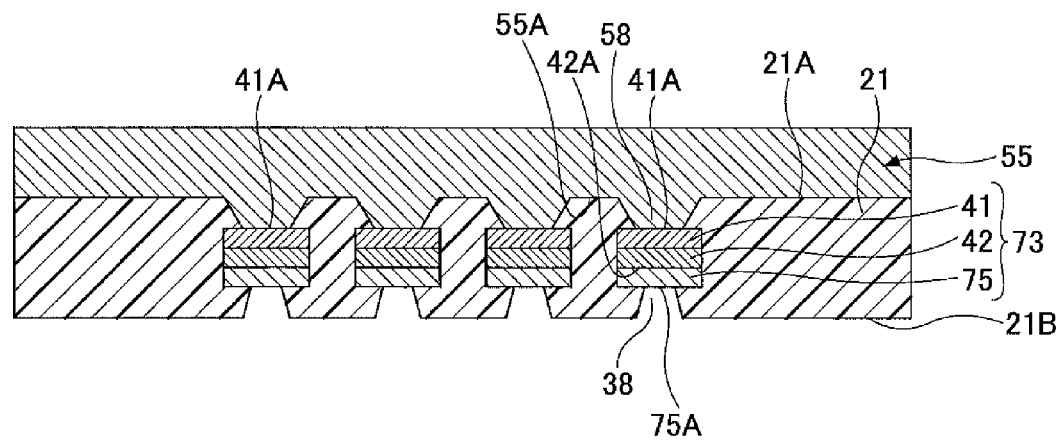

Next, in an insulator layer forming process illustrated in FIG. 31, the insulator layer 21 having the openings 38 is formed to cover the electrode pads 73, the projecting parts 58, and the surface 55A of the support plate 55 on the side formed with the projecting parts 58.

Accordingly, the outer peripheral portion of the surface of the electrode pad 73 on the side provided with the terminal 12, that is, the surface 41A of the metal layer 41, is covered by the insulator layer 21. For this reason, it is possible to suppress the generation of delamination between the side surface of the electrode pad 73 and the side surface of the insulator layer 21, and to improve the reliability of the wiring board 71.

The thickness of the insulator layer 21 provided on the surface 55A of the support plate 55 may be 65 μm to 75 μm, for example.

The semiconductor device 70 of this second embodiment is fabricated by carrying out processes similar to the processes described above in conjunction with FIGS. 23 through 25, after the insulator layer forming process.

According to the method of fabricating the semiconductor device of this second embodiment utilizing the other fabrication processes, the protection layer 78 made of the metal different from the first metal is formed on the surface 75A of the metal layer made of the first metal forming the support plate 55. Thereafter, the projecting parts 58 are formed on the support plate 55 by etching the support plate 55. Hence, it is possible to prevent the metal layer 75 from being etched in the projecting part forming process.

According to the method of fabricating the semiconductor device of this second embodiment utilizing the other fabrication processes, it is possible to obtain effects similar to those obtainable by the fabrication processes described above in conjunction with FIGS. 19 through 25.

FIGS. 32 through 39 are cross sectional views for explaining still other fabrication processes of the semiconductor device in the second embodiment of the present invention, that may be used to fabricate the semiconductor device in the second embodiment. In FIGS. 32 through 39, those parts that are the same as those corresponding parts of the semiconductor device 70 of the second embodiment illustrated in FIG. 18 are designated by the same reference numerals.

A description will be given of this still other fabrication processes that may be used to fabricate the semiconductor device 70 of this second embodiment, by referring to FIGS. 32 through 39. First, a process similar to the process of the first embodiment described above in conjunction with FIG. 3 is carried out to form the structure illustrated in FIG. 3.

Figure 32:
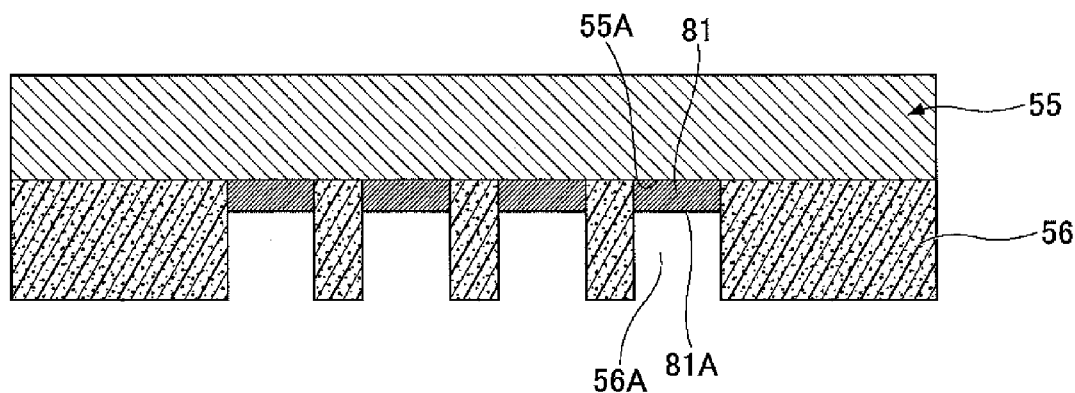
FIGS. 32 through 39 are cross sectional views for explaining still other fabrication processes of the semiconductor device in the second embodiment of the present invention.

Next, in a metal layer forming process for forming the projecting part illustrated in FIG. 32, a metal layer 81 for forming the projecting part is formed on the surface 55A of the support plate 55 at portions exposed by the openings 56A. More particularly, the metal layer 81 is formed by electroplating using the support plate 55 as a feed layer. For example, a Sn layer, a Sn—Pb layer or the like, formed by electroplating, for example, may be used for the metal layer 81. In this case, the height of the metal layer 81 may be 1 μm to 30 μm, and preferably 20 μm, for example.

Figure 33:
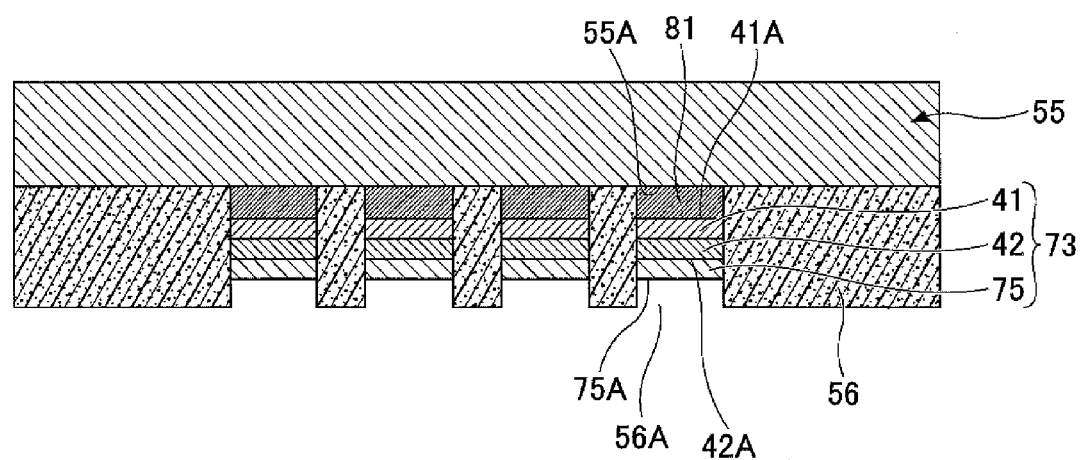

Next, in an electrode pad forming process illustrated in FIG. 33, the electrode pads 73 are formed by successively stacking the metal layer 41, the metal layer 42 and the metal layer 75 by processes similar to the process described above in conjunction with FIGS. 4 and 26.

Figure 34:
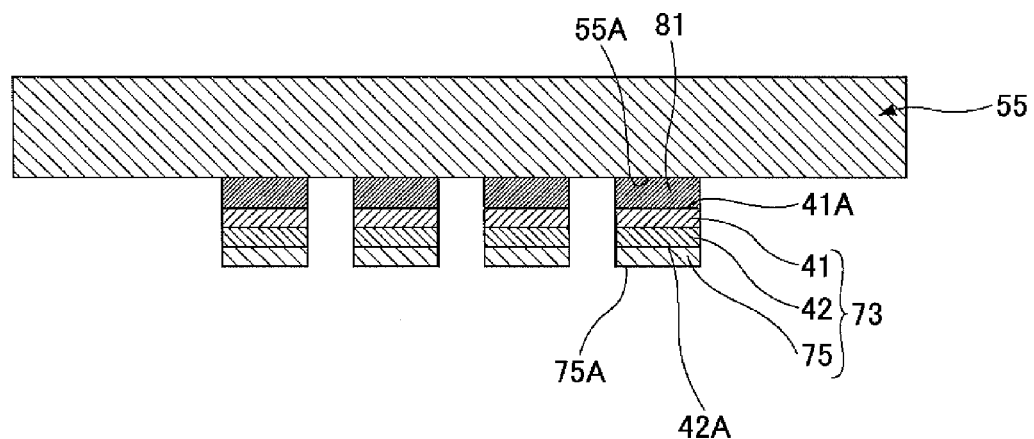
Figure 35:
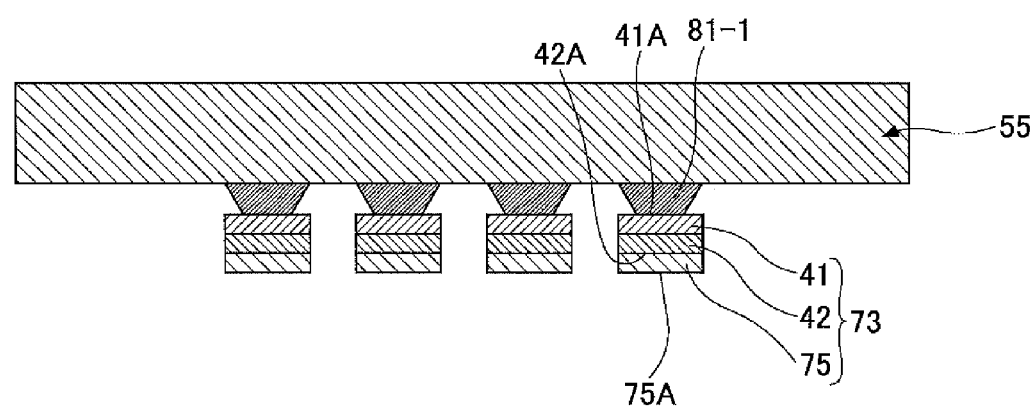

Next, in a process illustrated in FIG. 34, the resist layer 56 in FIG. 33 is removed. Then, in a projecting part forming process illustrated in FIG. 35, the metal layer 81 is etched to form projecting parts 81-1 which expose the outer peripheral portion of the surface 41A of the metal layer 41 formed on the side making contact with the metal layer 81. More particularly, the projecting parts 81-1 are formed by using an etchant, such as a fluorine-hydrogen-peroxide system etchant, which removes only the metal layer 81.

By carrying out an isotropic wet etching using the electrode pads 73 as a mask, it is possible to expose the outer peripheral portion of the surface 41A of the metal layer 41 from the projecting parts 81-1, utilizing the side etching and undercut with respect to the metal layer 81 achieved by the etchant.

For example, the projecting part 81-1 may have a truncated cone shape. In this case, in the cross sectional view, the side surface of the projecting part 81-1 having the truncated cone shape may be curved inwards in a gull-wing shape relative to a center axis of the truncated cone shape.

It is possible to prevent the electrode pads 73 from being etched by use of an etchant which etches only the metal layer 81.

In a case where the diameter of the metal layer 41 is 100 μm, the diameter of the projecting part 81-1 at the portion in contact with the metal layer 41 may be 80 μm to 90 μm, for example.

Figure 36:
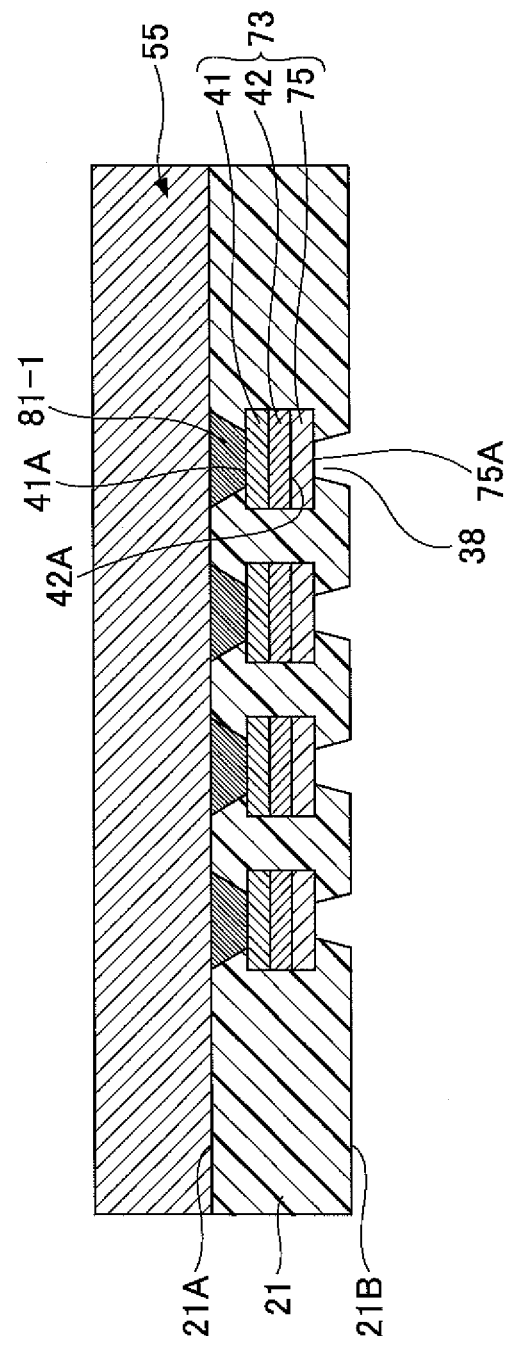

Next, in an insulator layer forming process illustrated in FIG. 36, the insulator layer 21 having the openings 38 is formed to cover the etched projecting parts 81-1, the electrode parts 73, and the surface 55A of the support plate 55 on the side formed with the projecting parts 81-1.

Figure 37:
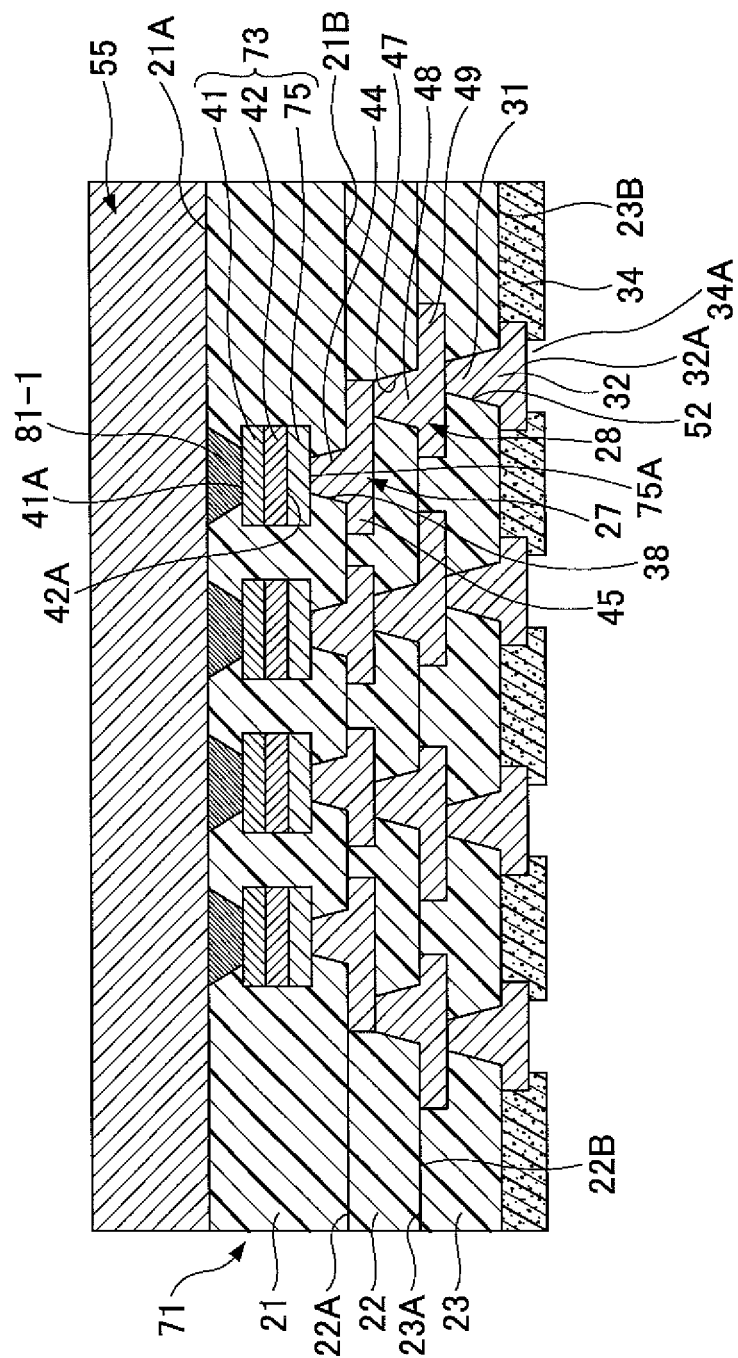

Next, in a process illustrated in FIG. 37, a process similar to the process described above in conjunction with FIG. 23, including the conductor pattern forming process, is carried out to form the conductor patterns 27 and 28, the vias 31, the pads 32, and the solder resist layer 34. As a result, a structure corresponding to the wiring board 71 is formed on the support plate 55.

Figure 38:
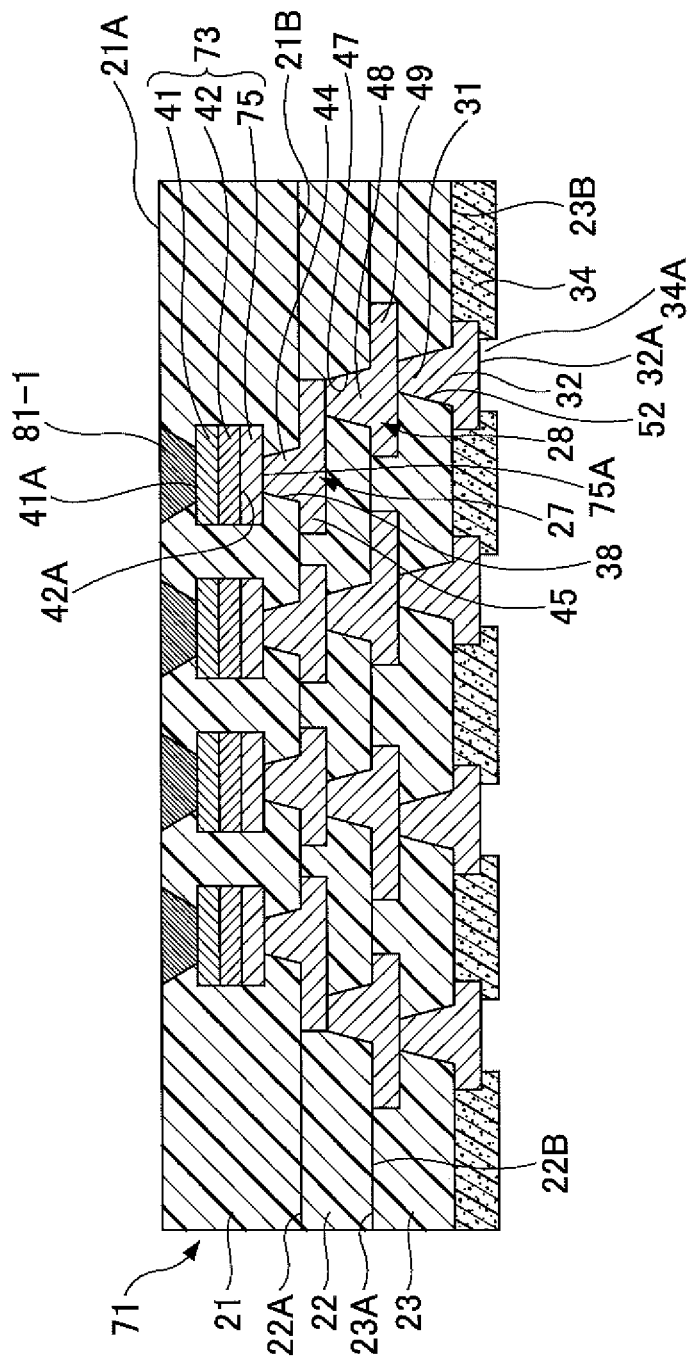

Next, in a support plate removing process illustrated in FIG. 38, a process similar to the process described above in conjunction with FIG. 24 is carried out to remove the support plate 55. As a result, the projecting parts 81-1 are exposed.

Figure 39:
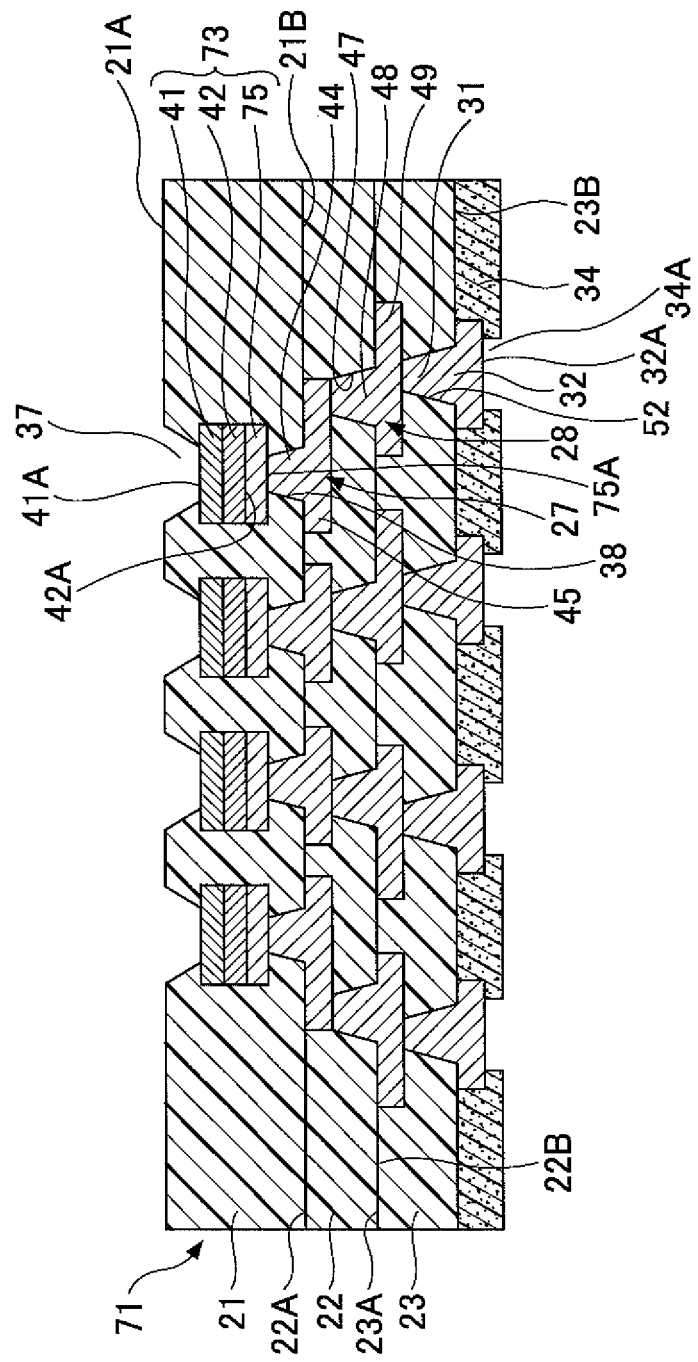

Then, in a projecting part removing process illustrated in FIG. 39, the projecting parts 81-1 are removed to expose a portion of the surface (surface 41A of the metal layer 41) of the electrode pads 73 on the side in contact with the projecting parts 81-1, and the openings 37 having shapes corresponding to the shapes of the projecting parts 81-1 are formed in the insulator layer 21. As a result, the wiring board 71 is fabricated.

After the projecting part removing process, a process similar to the process described above in conjunction with FIG. 25 is carried out to fabricate the semiconductor device 70 of this second embodiment.

According to the method of fabricating the semiconductor device of this second embodiment utilizing the still other fabrication processes, the metal layer 81 is formed so that the metal layer 81 will be interposed between the support plate 55 and the electrode pads 73 formed thereafter. After the electrode pads 73 are formed by the electrode pad forming process, the metal layer 81 is etched to form the projecting parts 81-1 which expose the outer peripheral portion of the surface 41A of the metal layer 41. Thereafter, the insulator layer 21 is formed to cover the projecting parts 81-1, the electrode pads 73, and the surface 55A of the support plate 55 on the side formed with the projecting parts 81-1. For this reason, compared to the case where the openings 37 are formed by etching the support plate 55, it is possible to reduce the inconsistency in the depths of the openings 37 that are formed.

Furthermore, according to the method of fabricating the semiconductor device of this second embodiment utilizing the still other fabrication processes, it is possible to obtain effects similar to those obtainable by the fabrication processes described above in conjunction with FIGS. 19 through 25.

Third Embodiment

Figure 40:
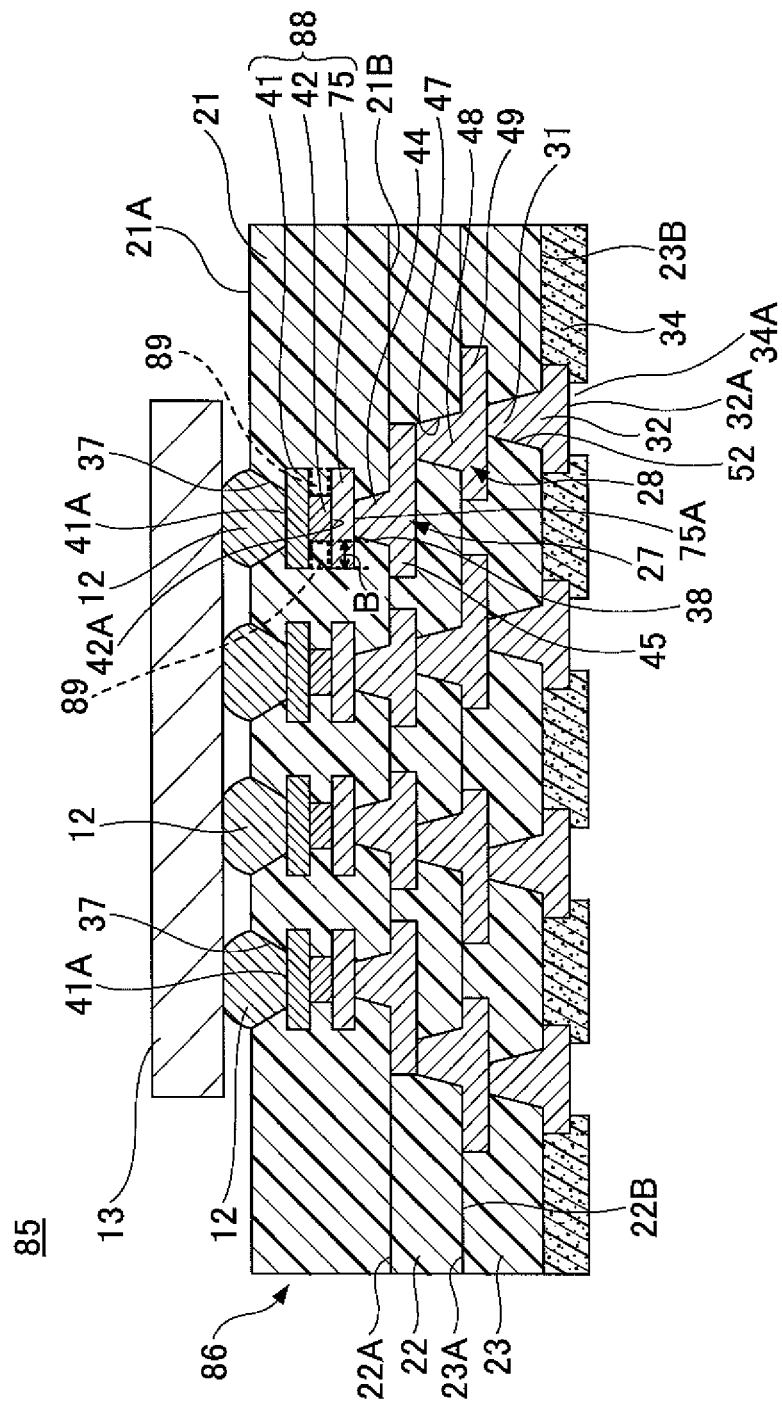
FIG. 40 is a cross sectional view illustrating the semiconductor device in a third embodiment of the present invention.

FIG. 40 is a cross sectional view illustrating the semiconductor device in a third embodiment of the present invention. In FIG. 40, those parts that are the same as those corresponding parts of the semiconductor device 70 of the second embodiment illustrated in FIG. 18 are designated by the same reference numerals.

As illustrated in FIG. 40, a semiconductor device 85 in this third embodiment is provided with a wiring board 86 in place of the wiring board 71 of the semiconductor device 70 of the second embodiment. Otherwise, the structure of the semiconductor device 85 is basically the same as that of the semiconductor device 70.

The wiring board 86 has electrode pads 88 in place of the electrode pads 73 of the wiring board 71. Otherwise, the structure of the wiring board 86 is basically the same as that of the wiring board 71.

In the electrode pad 88, the outer peripheral side surfaces of the (second) metal layer 42 are disposed on the inner side compared to the outer peripheral side surfaces of the (first and third) metal layers 41 and 75. Otherwise, the electrode pad 88 is formed similarly to the electrode pad 73.

Because the outer peripheral side surfaces of the metal layer 42 are disposed on the inner side compared to the outer peripheral side surfaces of the metal layers 41 and 75, a recess 89 filled with the insulator layer 21 is formed in the electrode pad 88. For this reason, the position of the electrode pad 88 is restricted by the insulator layer 21 within the recess 89, and the electrode pad 88 is more positively embedded in the insulator layer 21.

Moreover, the contact area between the insulator layer 21 and the electrode pad 88 increases by the provision of the recess 89, and it is possible to improve the bonding between the insulator layer 21 and the electrode pad 88.

For example, a distance B from the outer peripheral side surface of the metal layer 42 to the outer peripheral side surfaces of the metal layers 41 and 75 may be 5 μm to 20 μm.

According to the wiring board 86 of this third embodiment, the outer peripheral side surfaces of the metal layer 42 are disposed on the inner side compared to the outer peripheral side surfaces of the metal layers 41 and 75, and the recess 89 filled with the insulator layer 21 is formed in the electrode pad 88. For this reason, the position of the electrode pad 88 is restricted by the insulator layer 21 within the recess 89, and the electrode pad 88 is more positively embedded in the insulator layer 21. Moreover, because the contact area between the insulator layer 21 and the electrode pad 88 increases by the provision of the recess 89, it is possible to improve the bonding between the insulator layer 21 and the electrode pad 88.

FIGS. 41 through 49 are cross sectional views for explaining fabrication processes of the semiconductor device in the third embodiment of the present invention. In FIGS. 41 through 49, those parts that are the same as those corresponding parts of the semiconductor device 85 of the third embodiment illustrated in FIG. 40 are designated by the same reference numerals.

A description will be given of the method of fabricating the semiconductor device 85 of this third embodiment, by referring to FIGS. 41 through 49. First, a process similar to the process of the first embodiment described above in conjunction with FIG. 3 is carried out to form the structure illustrated in FIG. 3.

Figure 41:
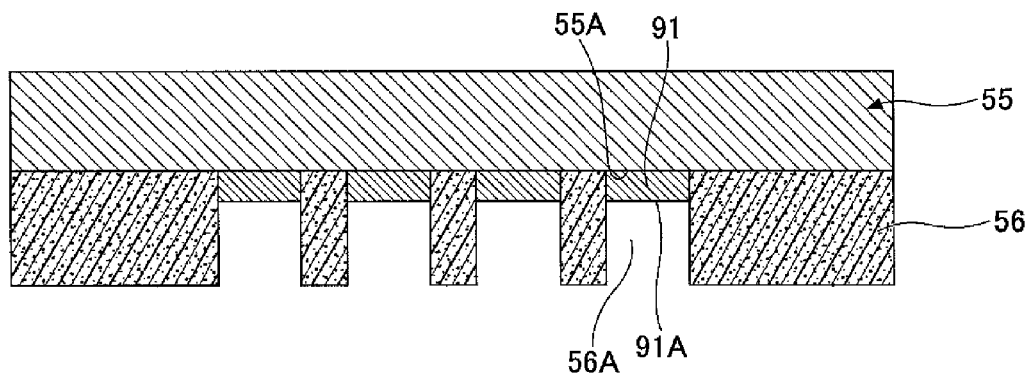
FIGS. 41 through 49 are cross sectional views for explaining fabrication processes of the semiconductor device in the third embodiment of the present invention.

Next, in a metal layer forming process for forming the projecting part illustrated in FIG. 41, a metal layer 91 for forming the projecting part, made of the same metal as the metal layer 42, is formed on the surface 55A of the support plate 55 at portions exposed by the openings 56A. More particularly, the metal layer 91 is formed by electroplating using the support plate 55 as a feed layer. When the metal layer 42 is formed by a Ni layer, for example, the metal layer 91 may be formed by a Ni layer. The thickness of the metal layer 91 may be 1 µm to 30 µm, and preferably 20 µm, for example.

Figure 42:
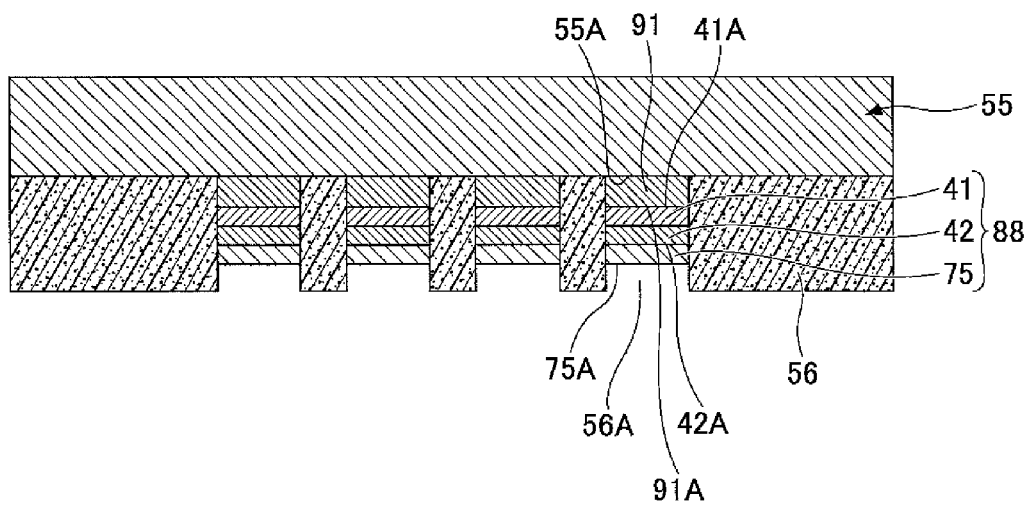

Next, in a process illustrated in FIG. 42, a process similar to the process of the second embodiment described above in conjunction with FIG. 33 is carried out to successively stack the metal layer 41, the metal layer 42 made of the same metal material as the metal layer 91, and the metal layer 75 on a surface 91A of the metal layer 91, to form the electrode pads 88. At this stage, the recess 89 is not yet formed in the electrode pad 88.

Figure 43:
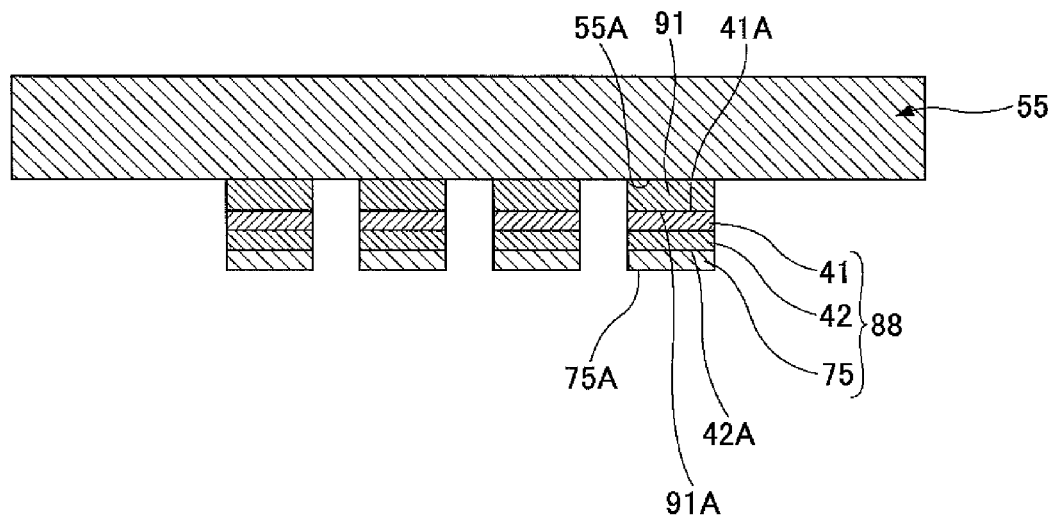
Figure 44:
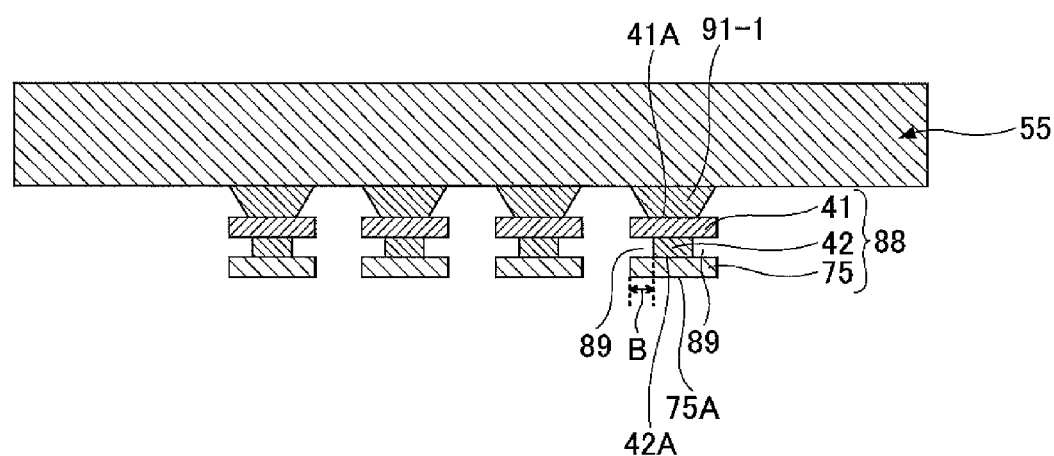

Next, in a process illustrated in FIG. 43, the resist layer 56 is removed. Then, in a projecting part forming process illustrated in FIG. 44, the metal layer 91 is etched using an etchant which etches only the metal layer 91 and does not etch the metal layer 41, the metal layer 75 and the support plate 55. As a result, projecting parts 91-1 which expose the outer peripheral portion of the surface 41A of the metal layer 41 are formed.

By carrying out an isotropic wet etching using the electrode pads 88 as a mask, it is possible to expose the outer peripheral portion of the surface 41A of the metal layer 41 from the projecting parts 91-1, utilizing the side etching and undercut with respect to the metal layer 91 achieved by the etchant.

For example, the projecting part 91-1 may have a truncated cone shape. In this case, in the cross sectional view, the side surface of the projecting part 91-1 having the truncated cone shape may be curved inwards in a gull-wing shape relative to a center axis of the truncated cone shape.

In the projecting part forming process, the recesses 89 are formed because the sidewalls of the metal layer 42, which is made of the same metal material as the metal layer 91, are also etched. Hence, the electrode pads 88 having the recesses 89 are formed by an electrode pad forming process.

Accordingly, it is possible to simultaneously form the recesses 89 and the projecting parts 91-1 which expose the outer peripheral portion of the surface 41A of the metal layer 41, by a single etching process, because the metal layer 91 and the metal layer 42 are made of the same metal material. Hence, it is possible to reduce the fabrication cost of the wiring board 86.

Figure 45:
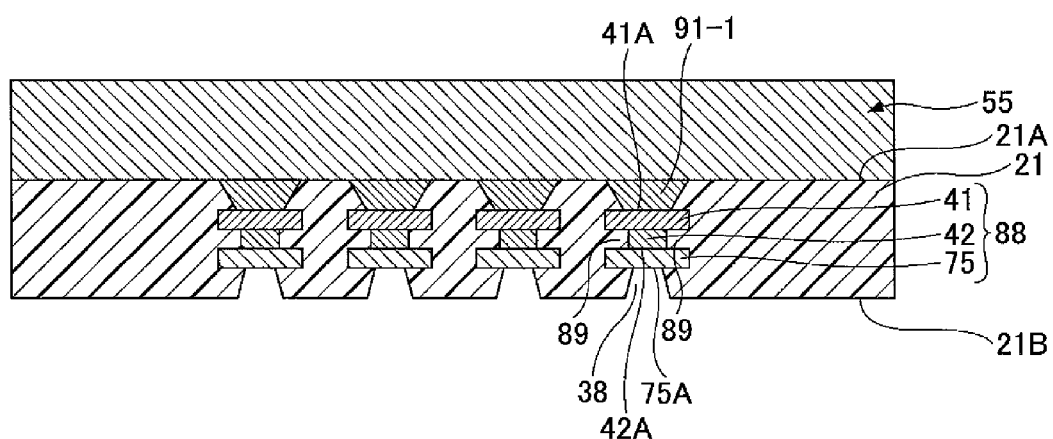

Next, in an insulator layer forming process illustrated in FIG. 45, the insulator layer 21 is formed to cover the projecting parts 91-1, the electrode pads 88, and the surface 55A of the support plate 55 on the side formed with the projecting parts 91-1. In addition, the openings 38 are formed in the insulator layer 21 at portions opposing the surface 75A of the metal layer 75, to expose the surface 75A of the metal layer 75.

Accordingly, the insulator layer 21 covers the outer peripheral portion of the surface (surface 41A of the metal layer 41) of the electrode pads 88 on the side provided with the terminals 12. Consequently, it is possible to suppress the generation of delamination between the side surface of the electrode pad 88 and the side surface of the insulator layer 21, and the reliability of the wiring board 86 can be improved.

In addition, the width of the outer peripheral portion of the surface 41A of the metal layer 41 covered by the insulator layer 21 may be 0.1 µm to 6 µm, and preferably 1 µm to 3 µm, for example.

Figure 46:
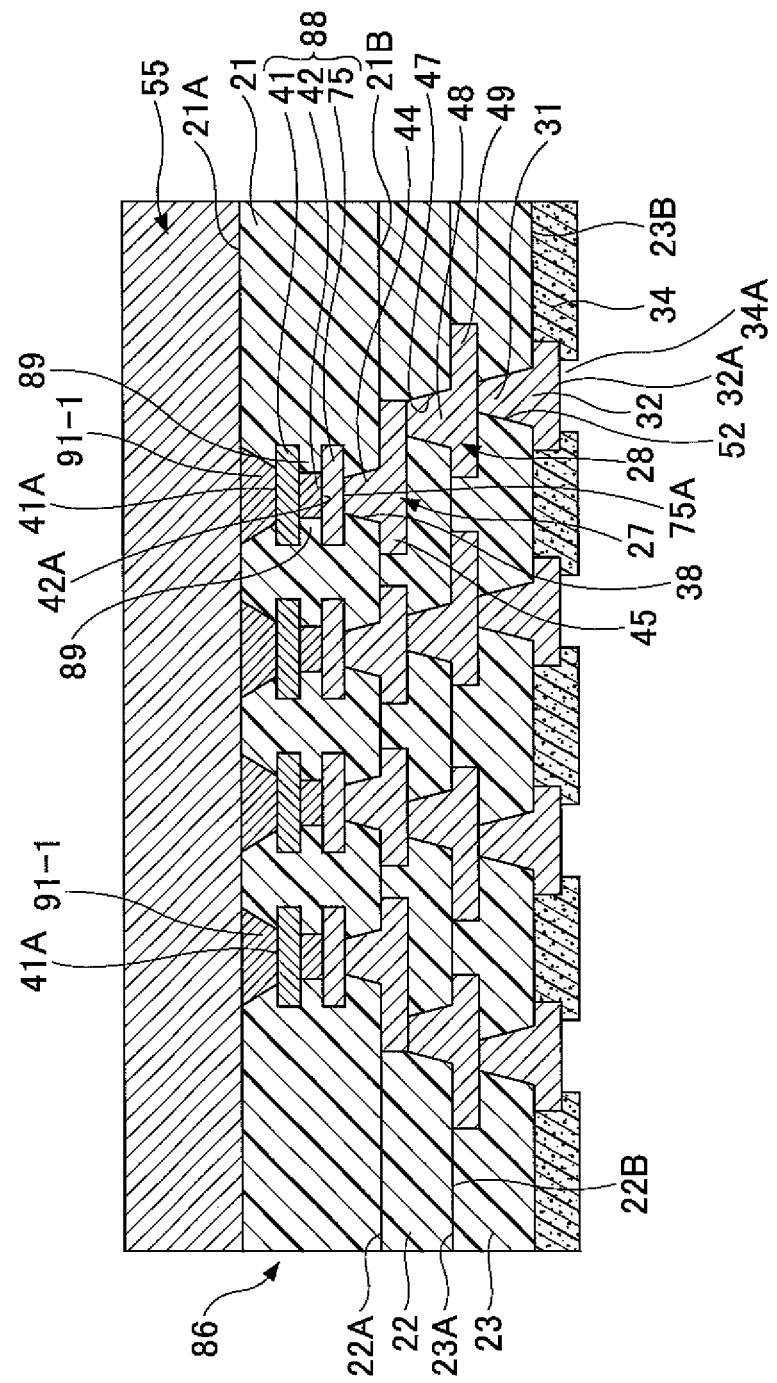

Next, in a process illustrated in FIG. 46, a process similar to the process of the second embodiment described above in conjunction with FIG. 23, including the conductor pattern forming process, is carried out to form the conductor patterns 27 and 28, the vies 31, the pads 32, and the solder resist layer 34. Hence, a structure corresponding to the wiring board 86 is formed on the support plate 55.

Figure 47:
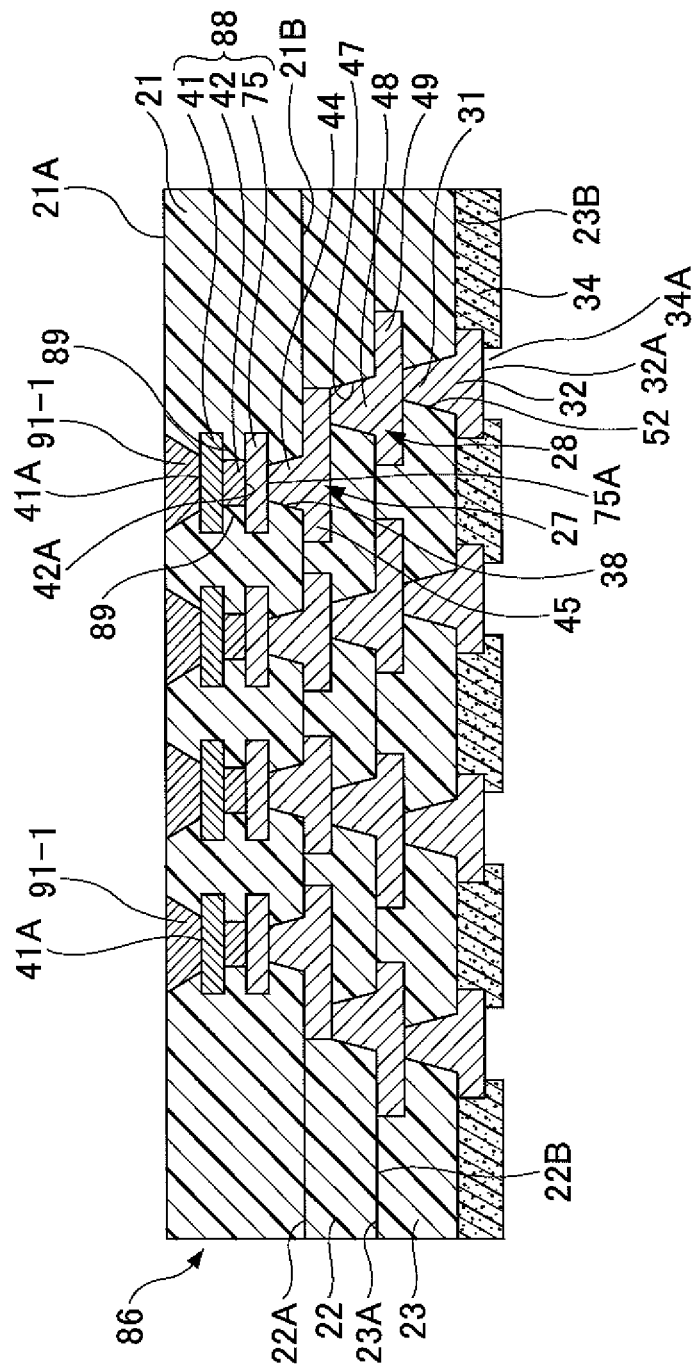

Next, in a support plate removing process illustrated in FIG. 47, the support plate 55 in FIG. 46 is removed by a process similar to the process of the second embodiment described above in conjunction with FIG. 24.

Figure 48:
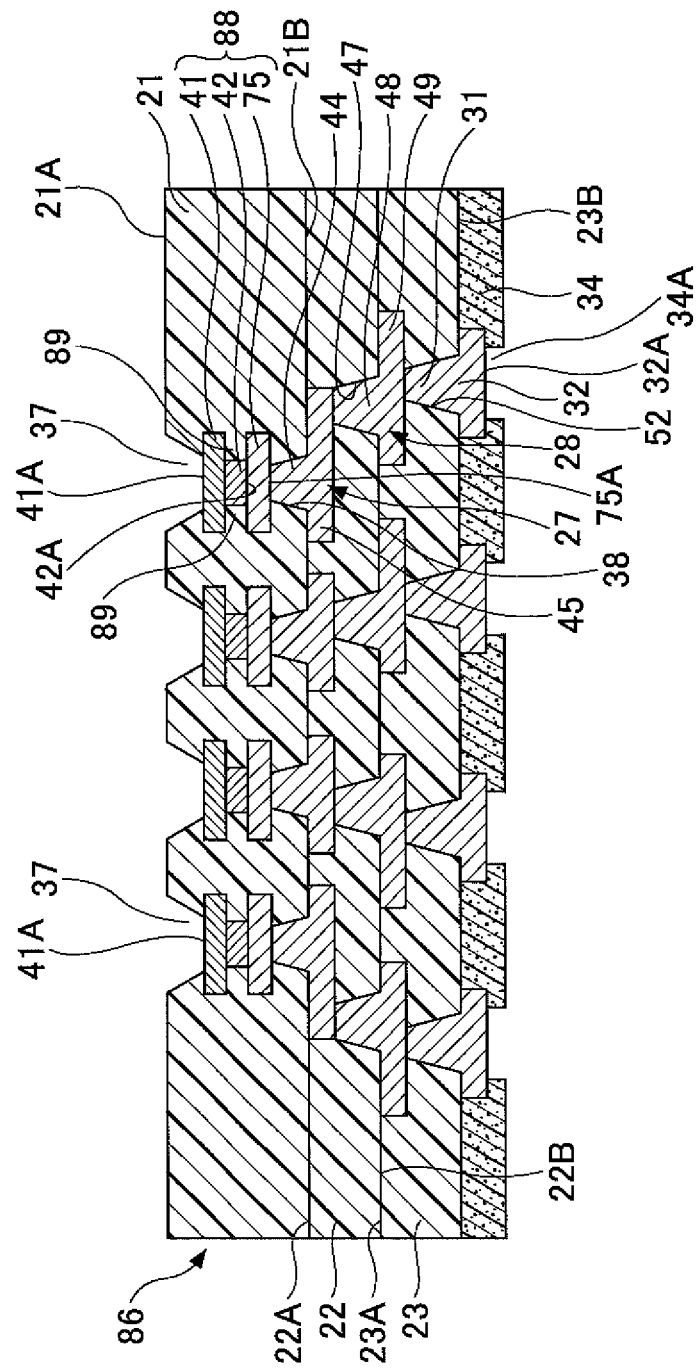

Next, in a projecting part removing process illustrated in FIG. 48, the projecting parts 91-1 in FIG. 47 are removed by using an etchant which removes only the projecting parts 91-1.

Figure 49:
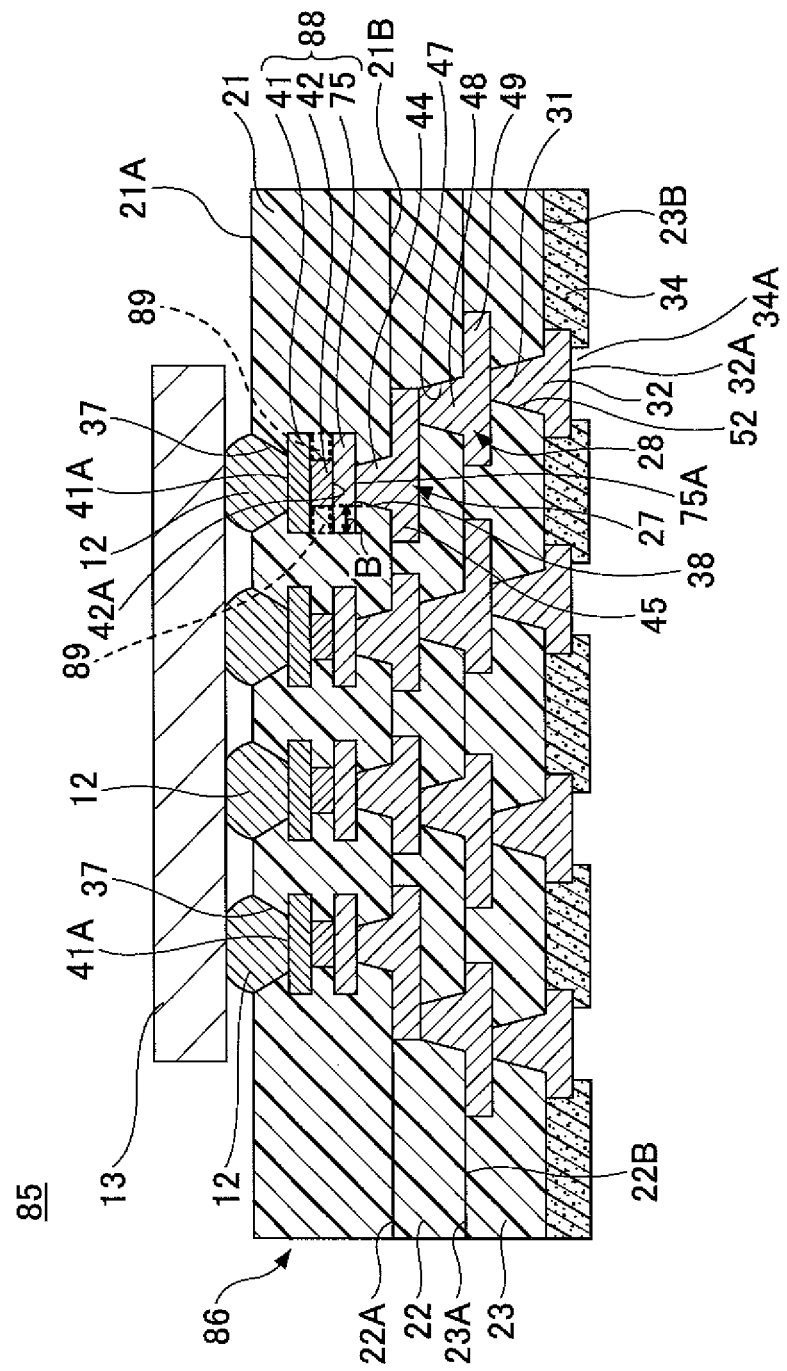

Next, in a process illustrated in FIG. 49, a process similar to the process of the second embodiment described above in conjunction with FIG. 25 is carried out to fabricate the semiconductor device 85 of this third embodiment.

According to the method of fabricating the wiring board 86 of this third embodiment, it is possible to simultaneously form the recesses 89 and the projecting parts 91-1 which expose the outer peripheral portion of the surface 41A of the metal layer 41, by a single etching process, because the metal layer 91 and the metal layer 42 are made of the same metal material. Hence, it is possible to reduce the fabrication cost of the wiring board 86.

Furthermore, after exposing the outer peripheral portion of the surface 41A of the metal layer 41 and forming the recesses 89 in the electrode pads 88, the insulator layer 21 is formed to cover the projecting parts 91-1, the electrode pads 88, and the surface 55A of the support plate 55 on the side formed with the projecting parts 91-1, in order to fill the recesses 89 by the insulator layer 21. As a result, the bonding between the electrode pads 88 and the insulator layer 21 is improved, and the positions of the electrode pads 88 are restricted within the insulator layer 21.

Fourth Embodiment

Figure 50:
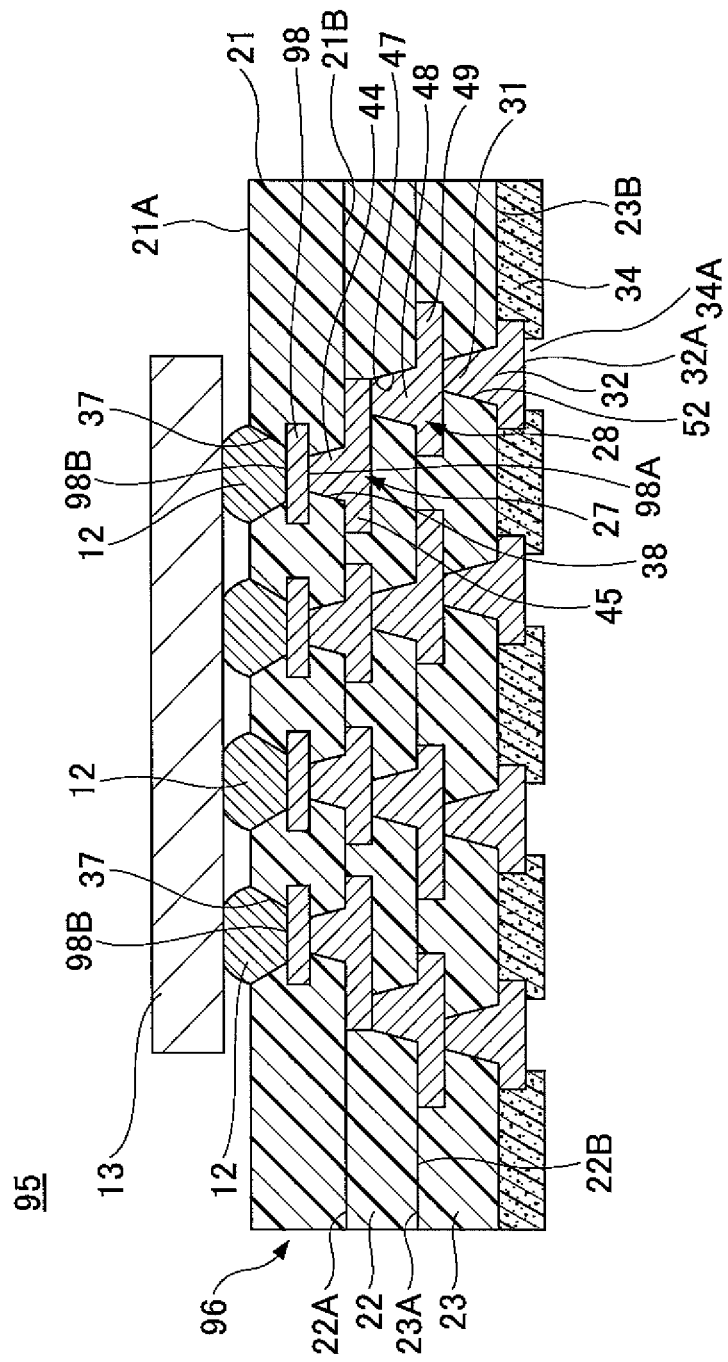
FIG. 50 is a cross sectional view illustrating the semiconductor device in a fourth embodiment of the present invention.

FIG. 50 is a cross sectional view illustrating the semiconductor device in a fourth embodiment of the present invention. In FIG. 50, those parts that are the same as those corresponding parts of the semiconductor device 10 of the first embodiment illustrated in FIG. 2 are designated by the same reference numerals.

As illustrated in FIG. 50, a semiconductor device 95 in this fourth embodiment is provided with a wiring board 96, in place of the wiring board 11 provided in the semiconductor device 10 of the first embodiment. Otherwise, the structure of the semiconductor device 95 is basically the same as that of the semiconductor device 10.

The wiring board 96 is provided with electrode pads 98 formed by a single metal layer, in place of the electrode pads 25 provided in the wiring board 11. Otherwise, the structure of the wiring board 96 is basically the same as that of the wiring board 11.

The electrode pads 98 are embedded within the insulator layer 21. A portion of a surface 98A of the electrode pad 98 is exposed at the opening 38. The portion of the electrode pad 98 exposed by the opening 38 is connected to the conductor pattern 27.

A central portion of a surface 98B of the electrode pad 98 on the side formed with the terminal 12, is exposed at the opening 37. An outer peripheral portion of the surface 98B of the electrode pad 98 is covered by the insulator layer 21.

By covering the outer peripheral portion of the surface 98B of the electrode pad 98 on the side formed with the terminal 12, by the insulator layer 21, it is possible to suppress the generation of delamination between the side surface of the electrode pad 98 and the side surface of the insulator layer 21. Hence, the reliability of the wiring board 96 can be improved.

The portion of the electrode pad 98 exposed at the opening 37 is electrically connected to the electronic component 13 via the terminal 12.

For example, Cu may be used for the electrode pads 98. In this case, the thickness of the electrode pad 98 may be 10 µm to 20 µm, and preferably 15 µm, for example.

When Cu is used for the electrode pads 98 and the metal material forming the conductor pattern 27 is also Cu, it is possible to improve the bonding between the electrode pads 98 and the conductor pattern 27. As a result, it is possible to improve the reliability of the electrical connection between the electrode pads 98 and the conductor pattern 27.

In a case where the electrode pads 98 are used to mount the electronic component 13 on the wiring board 96, the diameter of the electrode pad 98 may be 50 µm to 150 µm, for example. In addition, when the pads 32 are used to mount the electronic component 13 on the wiring board 96 and the electrode pads 98 are used to connect the wiring board 96 to a circuit board (not shown), the diameter of the electrode pad 98 may be 200 µm to 1000 µm, for example.

According to the semiconductor device 95 of this fourth embodiment, the outer peripheral portion of the surface 98B of the electrode pad 98 on the side formed with the terminal 12 is covered by the insulator layer 21. For this reason, it is possible to suppress the generation of delamination between the side surface of the electrode pad 98 and the side surface of the insulator layer 21, and the reliability of the wiring board 96 can be improved.

In addition, when Cu is used for the electrode pads 98 and the metal material forming the conductor pattern 27 is also Cu, it is possible to improve the bonding between the electrode pads 98 and the conductor pattern 27. As a result, it is possible to improve the reliability of the electrical connection between the electrode pads 98 and the conductor pattern 27.

Furthermore, it is possible to reduce the cost of the wiring board 96 by forming the electrode pads 98 by a single metal layer.

FIGS. 51 through 59 are cross sectional views for explaining fabrication processes of the semiconductor device in the fourth embodiment of the present invention. In FIGS. 51 through 59, those parts that are the same as those corresponding parts of the semiconductor device 95 of the fourth embodiment illustrated in FIG. 50 are designated by the same reference numerals.

A description will be given of the method of fabricating the semiconductor device 95 of this fourth embodiment, by referring to FIGS. 51 through 59. First, a process similar to the process of the first embodiment described above in conjunction with FIG. 3 is carried out to form the structure illustrated in FIG. 3.

Figure 51:
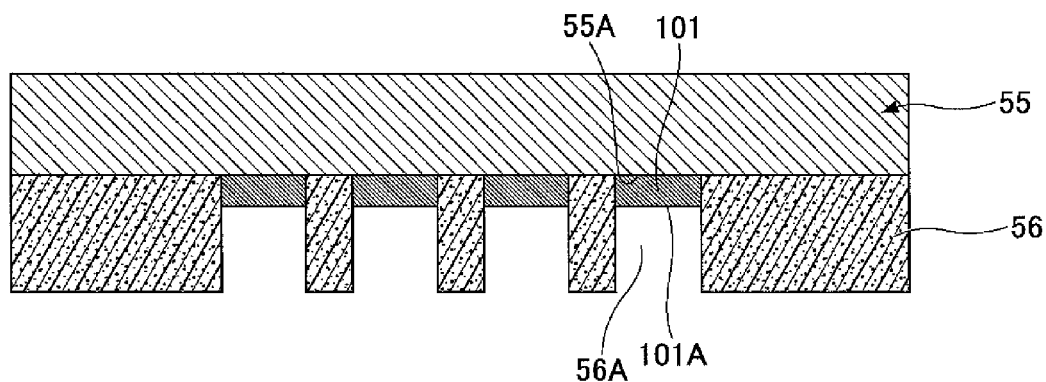
FIGS. 51 through 59 are cross sectional views for explaining fabrication processes of the semiconductor device in the fourth embodiment of the present invention.

Next, in a metal layer forming process for the projecting part illustrated in FIG. 51, a metal layer 101 for forming the projecting part, made of a material different from the first metal, is formed on the surface 55A of the support plate 55 at portions exposed by the openings 56A. More particularly, the metal layer 101 is formed by electroplating using the support plate 55 as a feed layer, for example. For example, the metal layer 101 may be formed by a Ni layer, a Sn layer, a Sn—Pb layer or the like. In this case, the thickness of the metal layer 101 may be 1 µm to 30 µm, and preferably 20 µm, for example.

Figure 52:
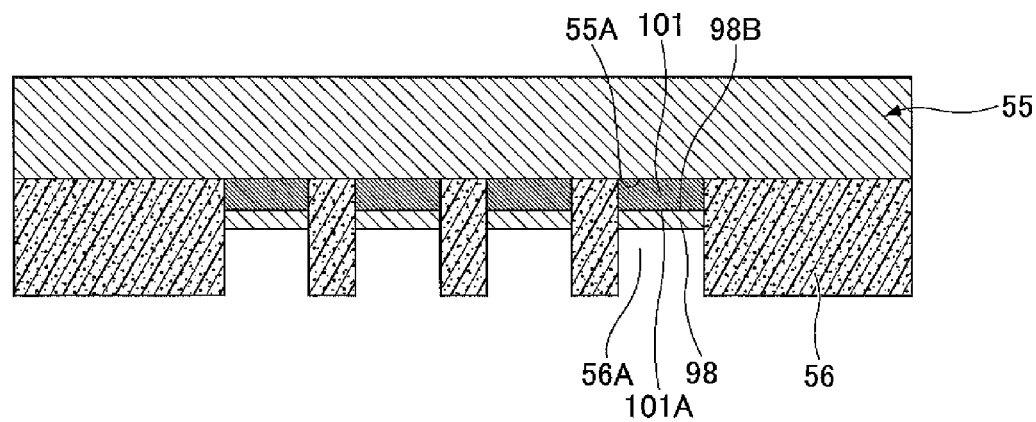

Next, in an electrode pad forming process illustrated in FIG. 52, the electrode pads 98 made of the first metal (for example, Cu) are formed on a surface 101A of the metal layer 101. More particularly, a Cu layer is formed by electroplating using the support plate 55 as a feed layer, for example, in order to form the electrode pads 98.

Figure 53:
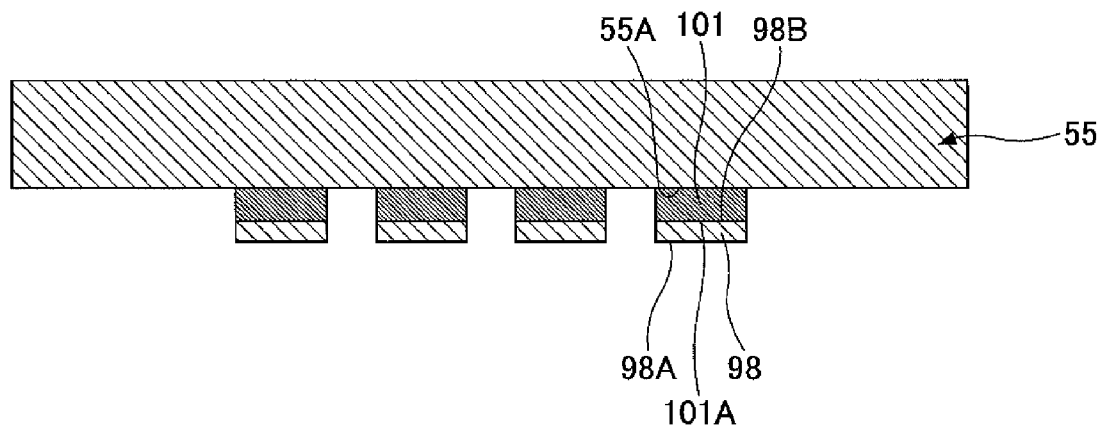
Figure 54:
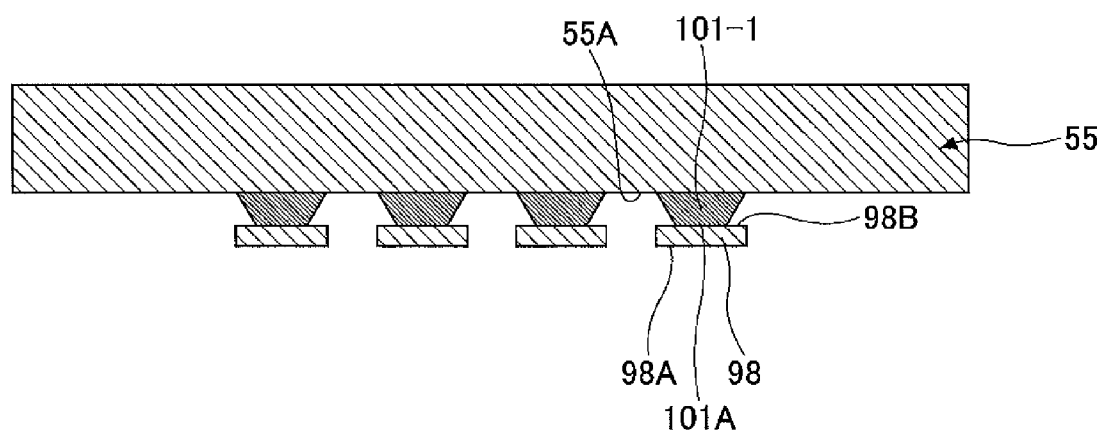

Next, in a process illustrated in FIG. 53, the resist layer 56 is removed. Next, in a projecting part forming process illustrated in FIG. 54, the metal layer 101 is etched using an etchant which etches only the metal layer 101, to form projecting parts 101-1 which exposes the outer peripheral portion of the surface 98B of the electrode pads 98 on the side making contact with the metal layer 101.

By carrying out an isotropic wet etching using the electrode pads 98 as a mask, it is possible to expose the outer peripheral portion of the surface 98B of the metal layer 98 from the projecting parts 101-1, utilizing the side etching and undercut with respect to the metal layer 101 achieved by the etchant.

For example, the projecting part 101-1 may have a truncated cone shape. In this case, in the cross sectional view, the side surface of the projecting part 101-1 having the truncated cone shape may be curved inwards in a gull-wing shape relative to a center axis of the truncated cone shape.

Figure 55:
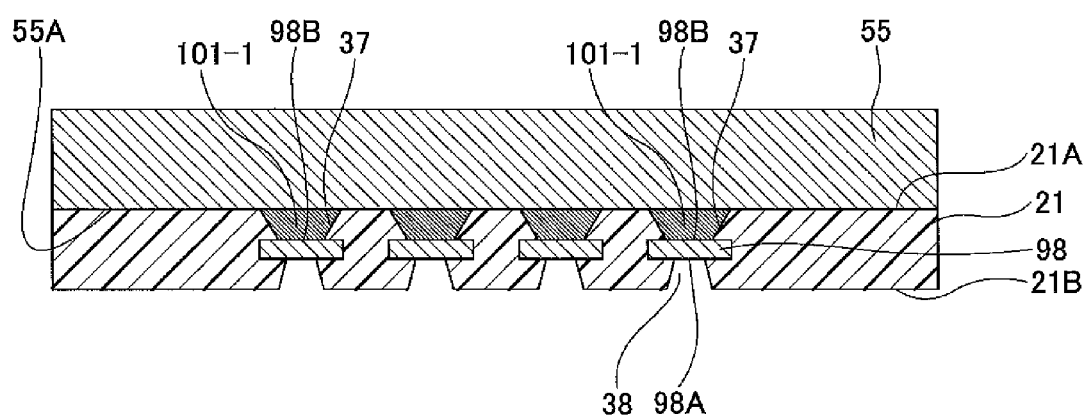

Next, in an insulator layer forming process illustrated in FIG. 55, the insulator layer 21 having the openings 38 is formed after the projecting part forming process to cover the projecting parts 101-1, the electrode pads 98, and the surface 55A of the support plate 55 on the side formed with the projecting parts 101-1.

By forming the insulator layer 21 to cover the outer peripheral portion of the surface 98B of the electrode pads 98 on the side formed with the terminals 12, it is possible to suppress the generation of delamination between the side surface of the electrode pad 98 and the side surface of the insulator layer 21. As a result, the reliability of the wiring board 96 can be improved.

The width of the outer peripheral portion of the surface 98B of the electrode pad 98 at the portion covered by the insulator layer 21 may be 0.1 µm to 6 µm, and preferably 1 µm to 3 µm, for example.

Figure 56:
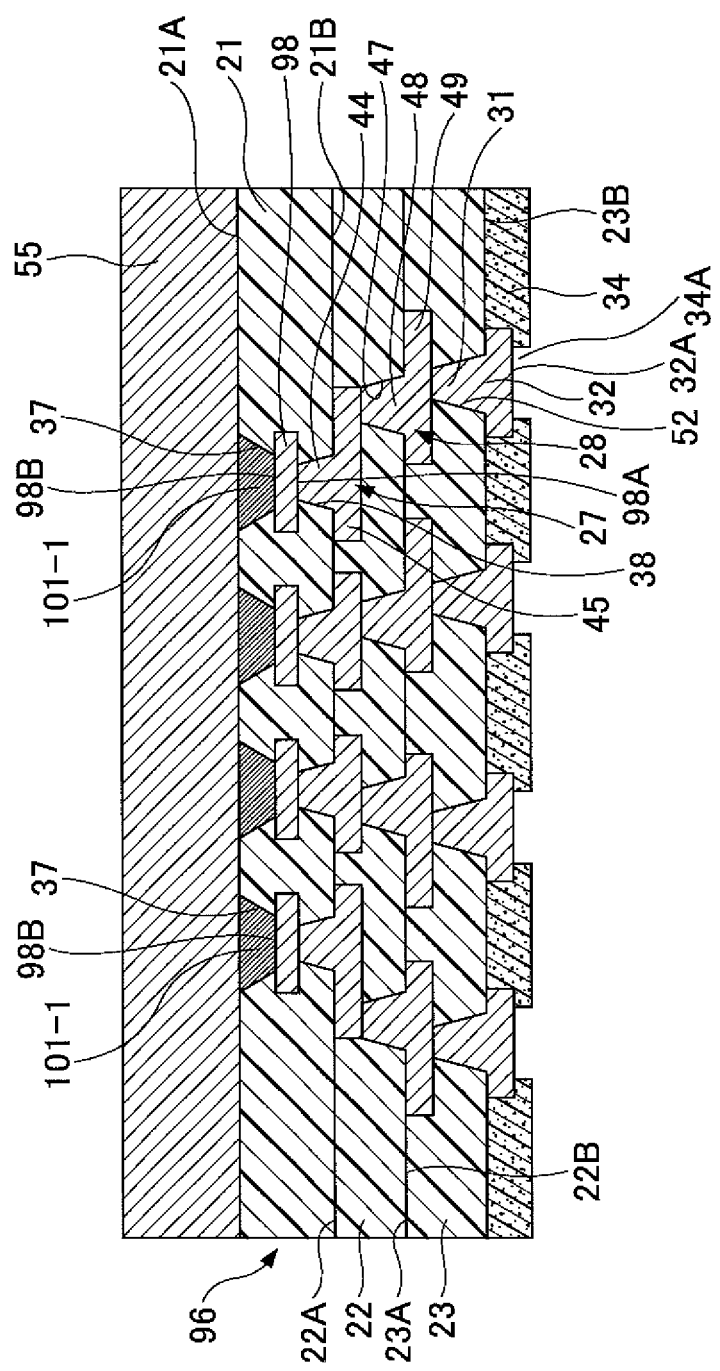

Next, in a process illustrated in FIG. 56, a process similar to the process of the third embodiment described above in conjunction with FIG. 46 is carried out to form the conductor patterns 27 and 28, the vias 31, the pads 32, and the solder resist layer 34. As a result, a structure corresponding to the wiring board 96 is formed on the support plate 55.

Figure 57:
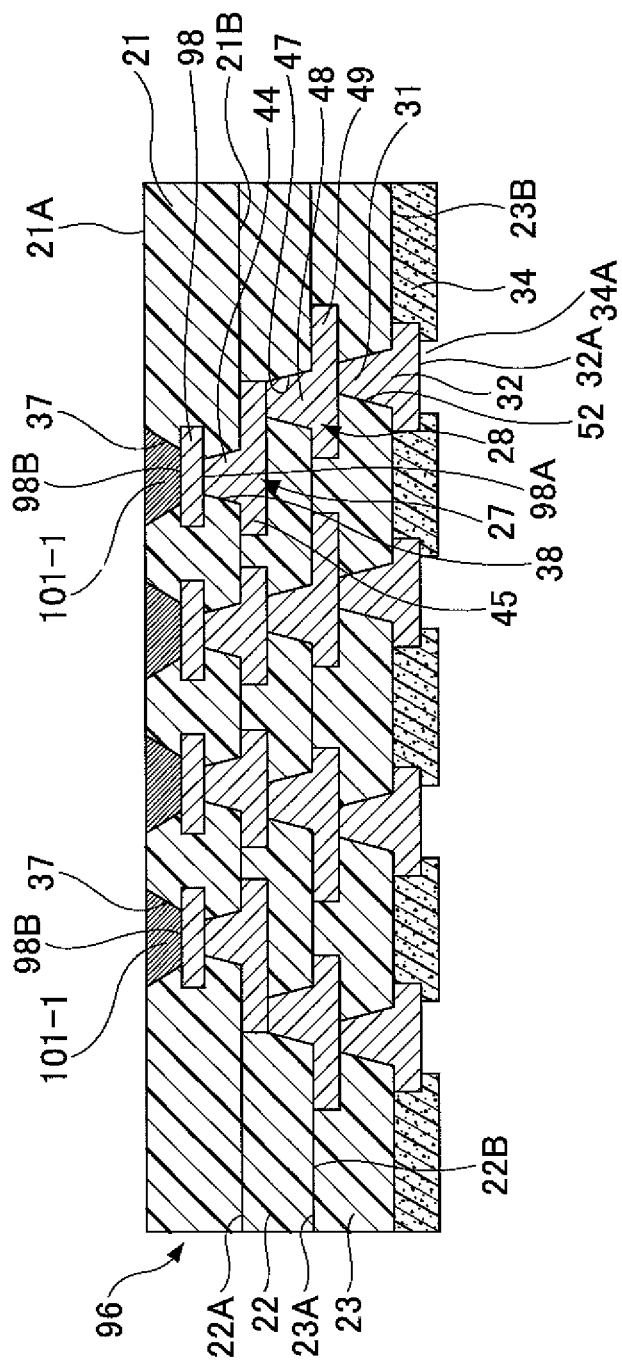

Next, in a support plate removing process illustrated in FIG. 57, the support plate 55 is removed by a process similar to the process of the third embodiment described above in conjunction with FIG. 47.

Figure 58:
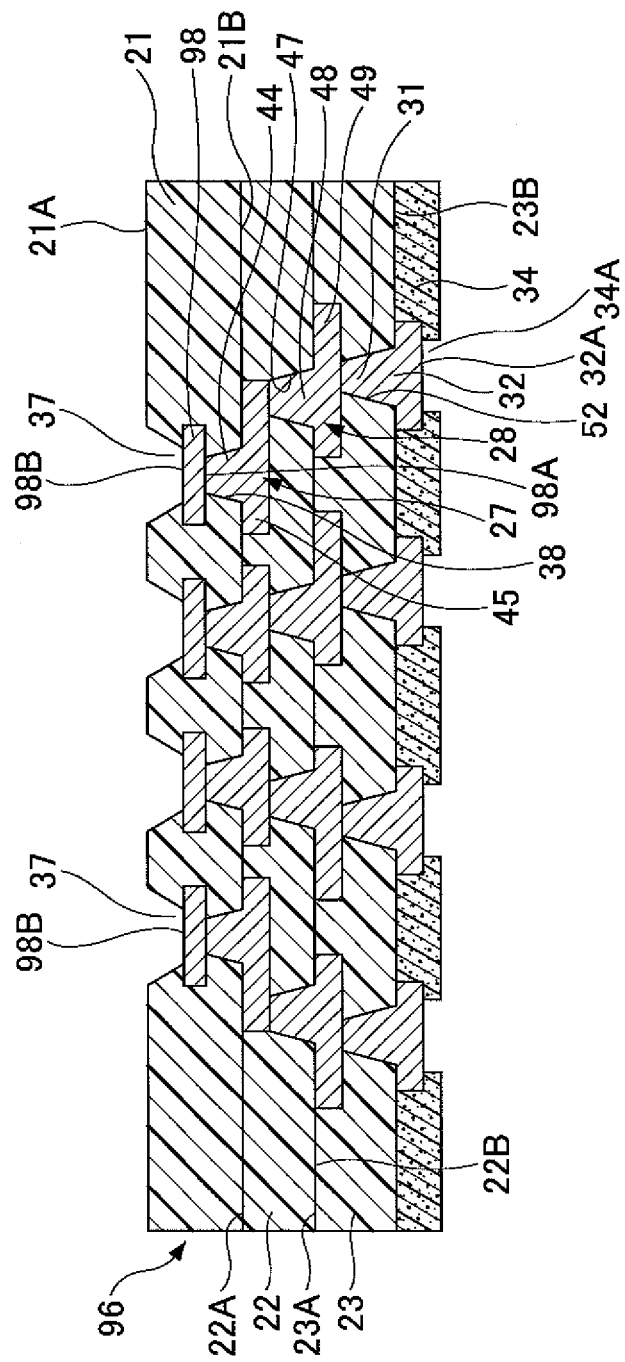

Next, in a projecting part removing process illustrated in FIG. 58, the projecting parts 101-1 are removed using an etchant which etches only the projecting parts 101-1. Hence, a portion of the surface 98B of the electrode pads 98 on the side contacting the projecting parts 101-1 is exposed, to thereby form the openings 37 having shapes corresponding to the shapes of the etched projecting parts 101-1. As a result, the wiring board 96 of the fourth embodiment is fabricated.

According to the method of fabricating the wiring board 96 of this fourth embodiment, the insulator layer 21 is formed to cover the outer peripheral portion of the surface 98B of the electrode pads 98 on the side formed with the terminals 12. For this reason, it is possible to suppress the delamination between the side surface of the electrode pad 98 and the side surface of the insulator layer 21, and the reliability of the wiring board 96 can be improved.

In addition, by forming the electrode pads 98 in the electrode pad forming process by forming only a single metal layer, the fabrication cost of the wiring board 96 can be reduced.

Figure 60:
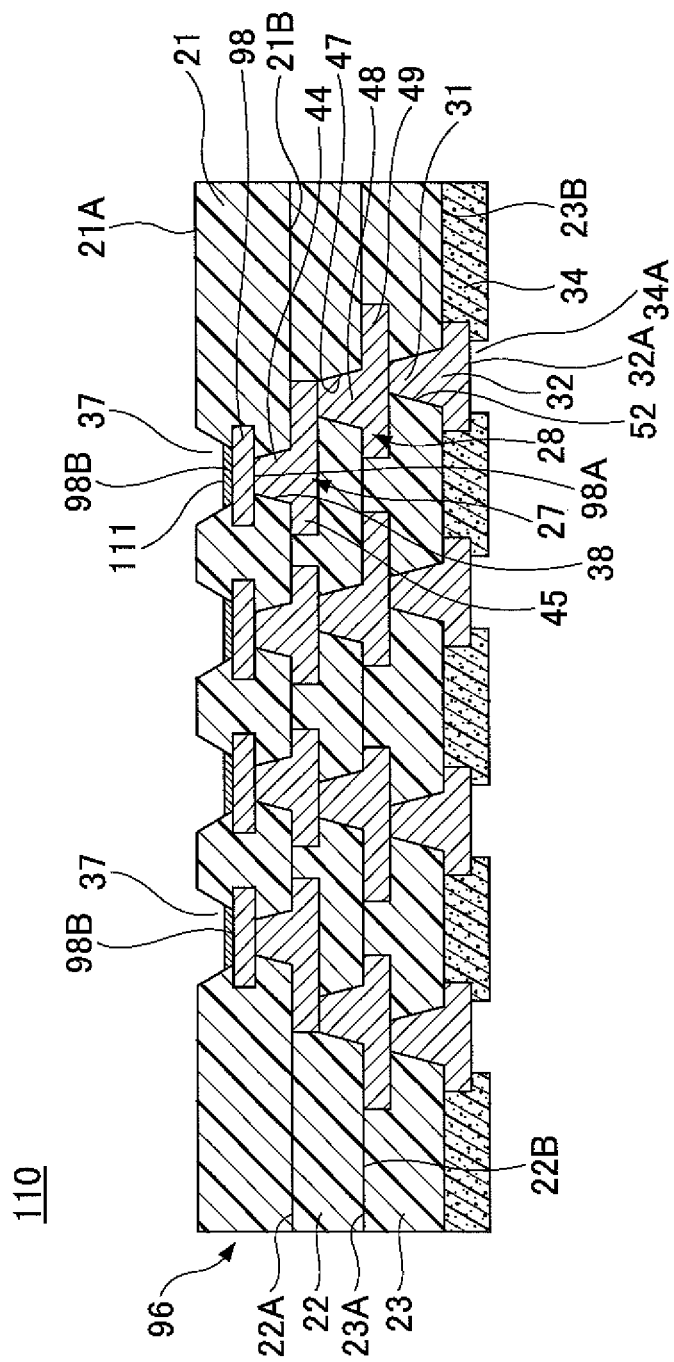
FIG. 60 is a cross sectional view illustrating an example of another wiring board.

FIG. 60 is a cross sectional view illustrating an example of another wiring board. In FIG. 60, those parts that are the same as the wiring board 96 of the fourth embodiment illustrated in FIG. 50 are designated by the same reference numerals.

It is possible to use a wiring board 110 illustrated in FIG. 60 in place of the wiring board 96 provided in the semiconductor device 95 of the fourth embodiment.

As illustrated in FIG. 60, the wiring board 110 has an Organic Solderability Preservative (OSP) layer 111 provided on the surface 98B of the electrode pads 98. Otherwise, the structure of the wiring board 110 is basically the same as the structure of the wiring board 96.

When the wiring board 110 having the structure described above is used in the semiconductor device 95, it is possible to secure sufficient wetting between the electrode pads 98 and solder when the solder is used for the terminal 12. Further, it is possible to prevent oxidation of the surface 98B of the electrode pads 98.

Figure 59:
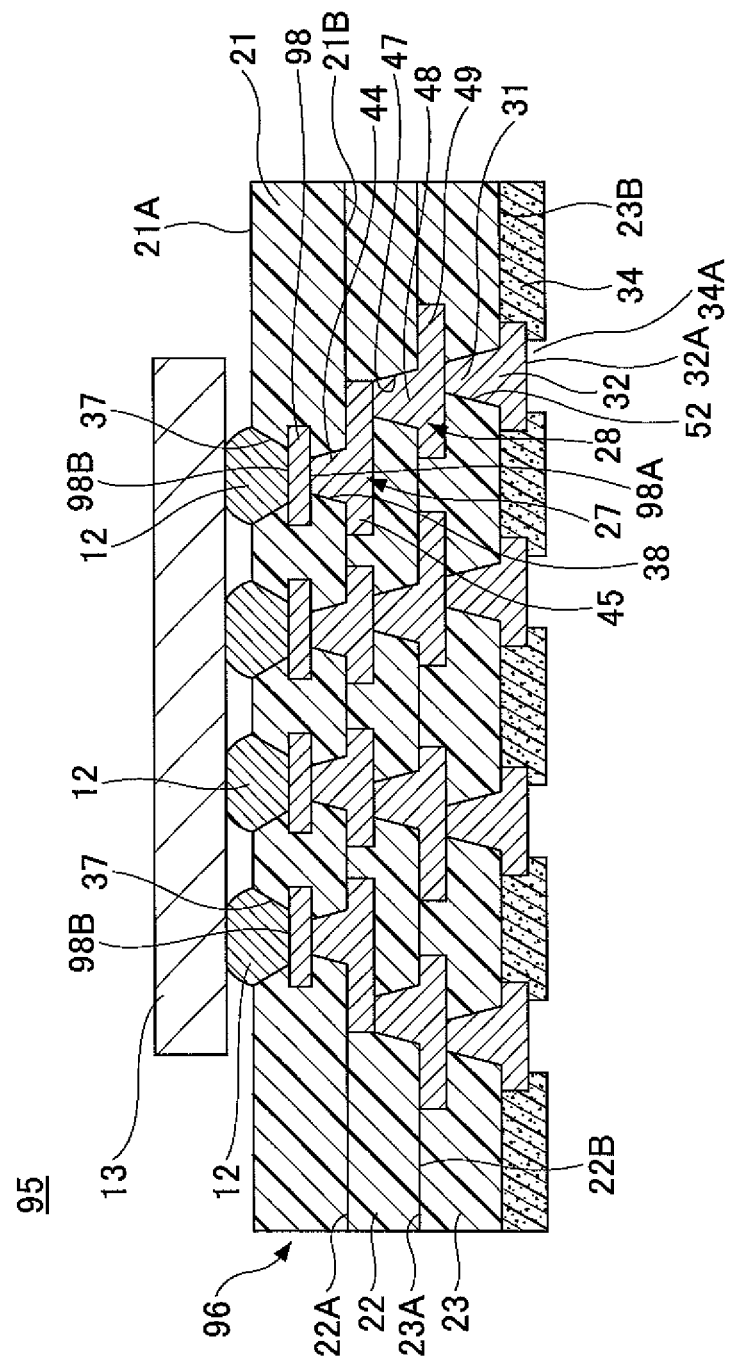

The surface 98B of the electrode pads 98 are processed by the OSP to form the OSP layer 111 on the surface 983 of the electrode pads 98 at the portions exposed by the openings 37 in an OSP layer forming process that is carried out between the projecting part removing process illustrated in FIG. 58 and the process illustrated in FIG. 59. Otherwise, the wiring board 110 may be fabricated by processes similar to the processes used to fabricate the wiring board 96 of the fourth embodiment.

Figure 61:
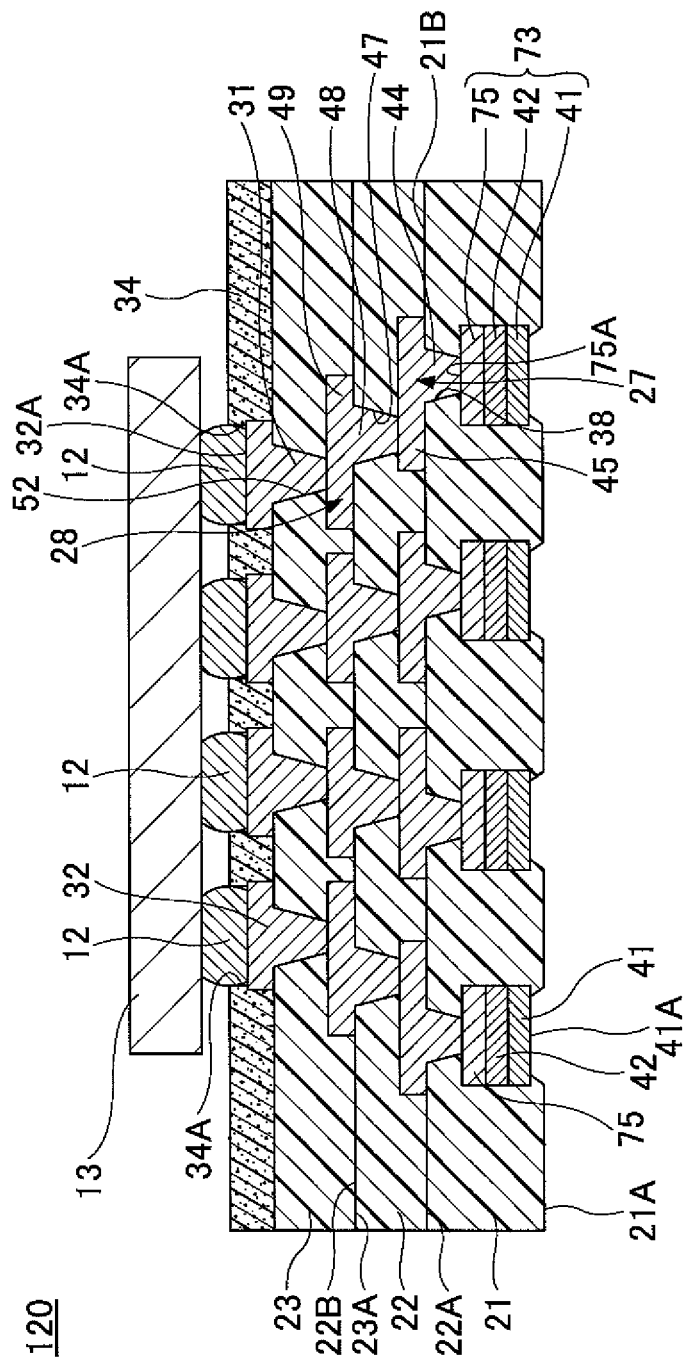
FIG. 61 is a cross sectional view illustrating the semiconductor device in a modification of the second embodiment of the present invention.

FIG. 61 is a cross sectional view illustrating the semiconductor device in a modification of the second embodiment of the present invention. In a semiconductor device 120 of this modification of the second embodiment, the electronic component 13 is connected to the pads 32. Otherwise, the structure of the semiconductor device 120 is basically the same as the structure of the semiconductor device 70 of the second embodiment. According to the semiconductor device 120, it is possible to obtain effects similar to the effects obtainable in the semiconductor device 70.

Figure 62:
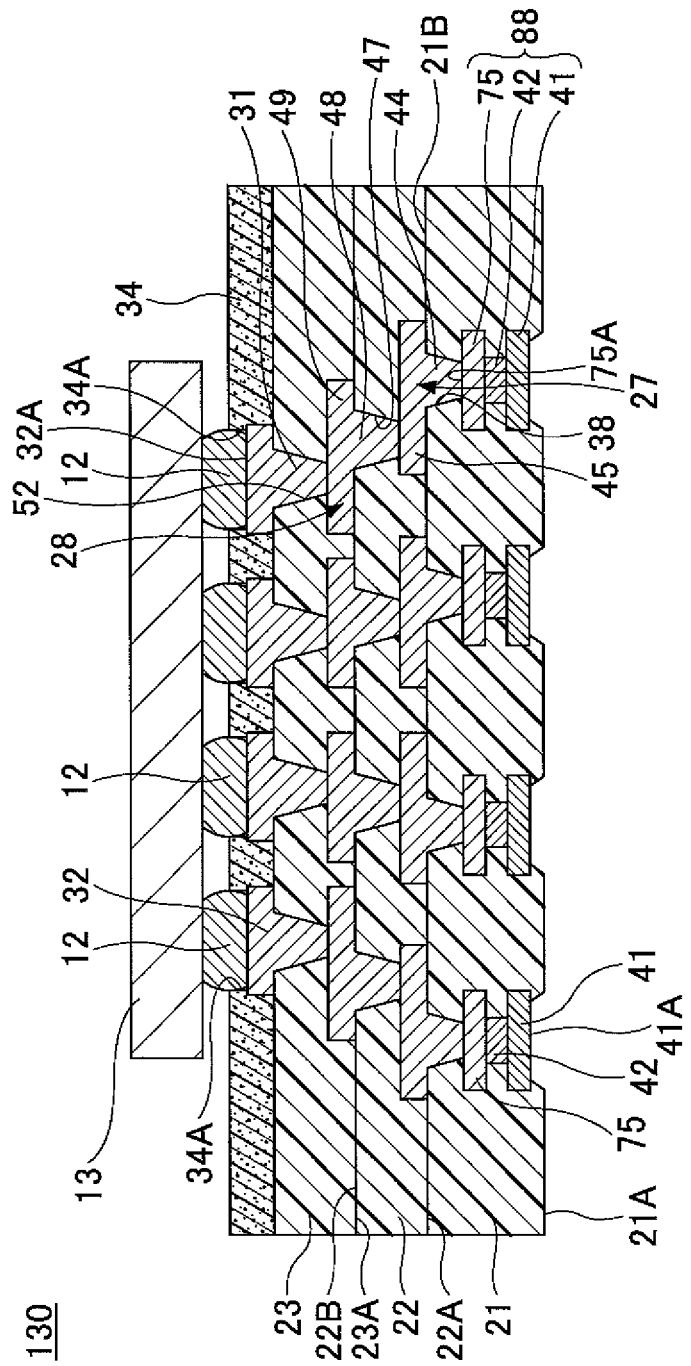
FIG. 62 is a cross sectional view illustrating the semiconductor device in a modification of the third embodiment of the present invention.

FIG. 62 is a cross sectional view illustrating the semiconductor device in a modification of the third embodiment of the present invention. In a semiconductor device 130 of this modification of the third embodiment, the electronic component 13 is connected to the pads 32. Otherwise, the structure of the semiconductor device 130 is basically the same as the structure of the semiconductor device 85 of the third embodiment. According to the semiconductor device 130, it is possible to obtain effects similar to the effects obtainable in the semiconductor device 85.

Figure 63:
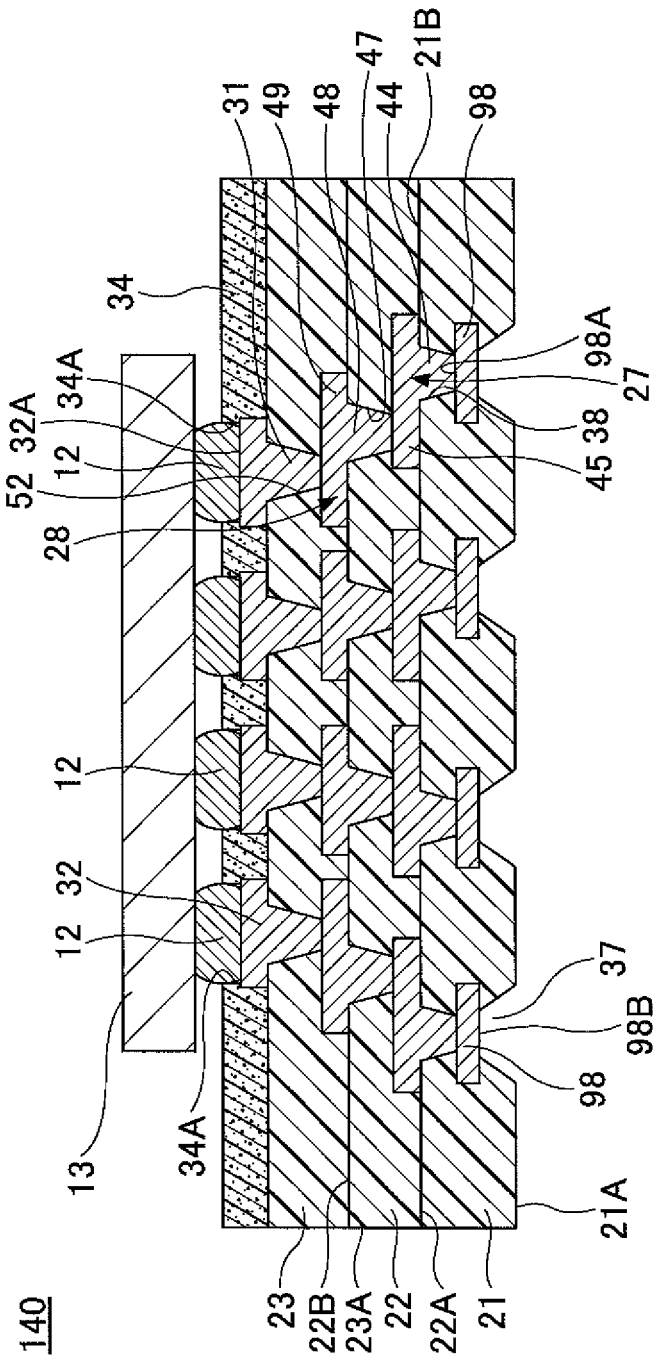
FIG. 63 is a cross sectional view illustrating the semiconductor device in a modification of the fourth embodiment of the present invention.

FIG. 63 is a cross sectional view illustrating the semiconductor device in a modification of the fourth embodiment of the present invention. In a semiconductor device 140 of this modification of the fourth embodiment, the electronic component 13 is connected to the pads 32. Otherwise, the structure of the semiconductor device 140 is basically the same as the structure of the semiconductor device 95 of the fourth embodiment. According to the semiconductor device 140, it is possible to obtain effects similar to the effects obtainable in the semiconductor device 95.

In each of the embodiments and modifications of the present invention, the metal layer for forming the projecting part may have an electrical conductivity different from that of the first metal.

Moreover, in each of the embodiments and modifications of the present invention, an underfill resin may be provided between the electronic component and the wiring board.

The embodiments and modifications of the present invention are applicable to wiring boards having electrode pads, conductor patterns connected to the electrode pads and an insulator layer embedded with the electrodes and the conductor patterns, and to methods of fabricating such wiring boards.

Further, the present invention is not limited to these embodiments, but various variations and modifications may be made without departing from the scope of the present invention.

What is claimed is:

1. A method of fabricating a wiring board, comprising:
    an electrode pad forming step forming an electrode pad on a support plate made of a first metal;
    a projecting part forming step forming, on the support plate at a portion opposing the electrode pad, a projecting part which exposes a surface of the electrode pad on a side opposing the support plate and contacts the electrode pad, by etching the support plate;
    an insulator layer forming step forming an insulator layer covering the electrode pad, the projecting part, and a surface of the support plate formed with the projecting part;
    a conductor pattern forming step forming, on the insulator layer, a conductor pattern connected to the electrode pad; and
    a support plate removing step removing the support plate formed with the projecting part by an etching, after the conductor pattern forming step, to thereby expose a portion of the surface of the electrode pad on the side opposing the support plate and form in the insulator layer an opening having a shape corresponding to a shape of the projecting part.

2. The method of fabricating the wiring board as claimed in claim 1, wherein the projecting part forming step etches the support plate so that the shape of the projecting part widens from the electrode pad towards the support plate.

3. The method of fabricating the wiring board as claimed in claim 1, wherein
    the electrode pad forming step includes:
        a first metal layer forming step forming a first metal layer made of a metal different from the first metal; and
        a second metal layer forming step forming, on the first metal layer, a second metal layer made of a metal different from the first metal, wherein the projecting part forming step etches the support plate using the electrode pad as a mask and using an etchant which selectively etches the first metal.

4. The method of fabricating the wiring board as claimed in claim 3, wherein the electrode pad forming step further includes:
a third metal layer forming step forming, on a surface of the second metal layer, a third metal layer made of the first metal, after the second metal layer forming step,
wherein the third metal layer forming step forms the third metal layer to a thickness sufficient to cover the surface of the second metal layer after the projecting part forming step is carried out.

5. The method of fabricating the wiring board as claimed in claim 3, wherein the electrode pad forming step further includes:
a third metal layer forming step forming, on a surface of the second metal layer, a third metal layer made of the first metal, after the second metal layer forming step; and a protection layer forming step forming, on the third metal layer, a protection layer which prevents etching of the third metal layer when the support plate is etched in the projecting part forming step,
and further comprising:
a protection layer removing step removing the protection layer, between the projecting part forming step and the insulator layer forming step.

6. The method of fabricating the wiring board as claimed in claim 1, further comprising:

a height adjusting layer forming step forming a height adjusting layer made of the first metal on a portion of the support plate corresponding to a region where the electrode pad is formed, prior to the electrode pad forming step,
wherein the support plate removing step removes the height adjusting layer together with the support plate using the etchant which selectively etches the first metal.

* * * * *